(12) United States Patent
Ma et al.

(10) Patent No.: US 11,342,228 B2
(45) Date of Patent: *May 24, 2022

(54) SEMICONDUCTOR DEVICE WITH MULTI-LAYERED SOURCE/DRAIN REGIONS HAVING DIFFERENT DOPANT CONCENTRATIONS AND MANUFACTURING METHOD THEREOF

(71) Applicant: Taiwan Semiconductor Manufacturing Co., Ltd., Hsinchu (TW)

(72) Inventors: Chih-Yu Ma, Hsinchu (TW); Zheng-Yang Pan, Zhubei (TW); Shahaji B. More, Hsinchu (TW); Shih-Chieh Chang, Taipei (TW); Cheng-Han Lee, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/983,527

(22) Filed: Aug. 3, 2020

(65) Prior Publication Data

US 2020/0365720 A1 Nov. 19, 2020

Related U.S. Application Data

(63) Continuation of application No. 16/505,061, filed on Jul. 8, 2019, now Pat. No. 10,734,524, which is a
(Continued)

(51) Int. Cl.
*H01L 21/8234* (2006.01)
*H01L 29/78* (2006.01)
(Continued)

(52) U.S. Cl.
CPC .. *H01L 21/823418* (2013.01); *H01L 21/0245* (2013.01); *H01L 21/0262* (2013.01);
(Continued)

(58) Field of Classification Search
CPC ......... H01L 21/02381; H01L 21/02532; H01L 21/02576; H01L 21/02579; H01L 21/0262;
(Continued)

(56) References Cited

U.S. PATENT DOCUMENTS 8,836,016 B2 9/2014 Wu et al.
8,841,701 B2 9/2014 Lin et al.
(Continued)

*Primary Examiner* — Cheung Lee
(74) *Attorney, Agent, or Firm* — Slater Matsil, LLP

(57) ABSTRACT

A method includes providing a substrate having a gate structure over a first side of the substrate, forming a recess adjacent to the gate structure, and forming in the recess a first semiconductor layer having a dopant, the first semiconductor layer being non-conformal, the first semiconductor layer lining the recess and extending from a bottom of the recess to a top of the recess. The method further includes forming a second semiconductor layer having the dopant in the recess and over the first semiconductor layer, a second concentration of the dopant in the second semiconductor layer being higher than a first concentration of the dopant in the first semiconductor layer.

20 Claims, 21 Drawing Sheets

Related U.S. Application Data continuation of application No. 15/725,580, filed on Oct. 5, 2017, now Pat. No. 10,347,764.

(60) Provisional application No. 62/527,850, filed on Jun. 30, 2017.

(51) Int. Cl.
  *H01L 29/66* (2006.01)
  *H01L 21/02* (2006.01)
  *H01L 23/532* (2006.01)
  *H01L 21/768* (2006.01)
  *H01L 23/522* (2006.01)
  *H01L 23/485* (2006.01)
  *H01L 29/08* (2006.01)
  *H01L 29/165* (2006.01)

(52) U.S. Cl.
  CPC .. *H01L 21/02381* (2013.01); *H01L 21/02532* (2013.01); *H01L 21/02639* (2013.01); *H01L 21/76843* (2013.01); *H01L 21/76871* (2013.01); *H01L 21/823431* (2013.01); *H01L 23/485* (2013.01); *H01L 23/5226* (2013.01); *H01L 23/53257* (2013.01); *H01L 29/0847* (2013.01); *H01L 29/6653* (2013.01); *H01L 29/6656* (2013.01); *H01L 29/66545* (2013.01); *H01L 29/66795* (2013.01); *H01L 29/7848* (2013.01); *H01L 29/785* (2013.01); *H01L 21/02576* (2013.01); *H01L 21/02579* (2013.01); *H01L 29/165* (2013.01)

(58) Field of Classification Search
  CPC ......... H01L 21/02639; H01L 21/76843; H01L 21/76871; H01L 21/82; H01L 21/8232; H01L 21/823418; H01L 21/823431; H01L 21/823468; H01L 21/8238; H01L 21/823814; H01L 21/823821; H01L 21/823864; H01L 23/485; H01L 23/5226; H01L 23/53257; H01L 29/0684; H01L 29/0847; H01L 29/165; H01L 29/66348; H01L 29/6653; H01L 21/0245; H01L 29/66545; H01L 29/6656; H01L 29/66795; H01L 29/7848; H01L 29/785
  See application file for complete search history.

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 2007/0012913 A1 | 1/2007 | Ohta et al. |
| 2007/0210301 A1 | 9/2007 | Han |
| 2008/0197412 A1 | 8/2008 | Zhang |
| 2009/0134381 A1 | 5/2009 | Shimamune et al. |
| 2010/0025771 A1 | 2/2010 | Hoentschel |
| 2010/0171181 A1 | 7/2010 | Rhee et al. |
| 2011/0104875 A1 | 5/2011 | Wojtczak et al. |
| 2012/0223364 A1 | 9/2012 | Chung et al. |
| 2013/0207166 A1 | 8/2013 | Chen et al. |
| 2014/0209978 A1 | 7/2014 | Kwok et al. |
| 2014/0302653 A1 | 10/2014 | Yeh |
| 2015/0206939 A1 | 7/2015 | Huang et al. |
| 2016/0027902 A1 | 1/2016 | Yoon |
| 2016/0190250 A1 | 6/2016 | Kwok et al. |

SEMICONDUCTOR DEVICE WITH MULTI-LAYERED SOURCE/DRAIN REGIONS HAVING DIFFERENT DOPANT CONCENTRATIONS AND MANUFACTURING METHOD THEREOF

PRIORITY CLAIM

This application is a continuation of U.S. patent application Ser. No. 16/505,061, filed on Jul. 8, 2019, entitled "Semiconductor Device with Multi-Layered Source/Drain Regions Having Different Dopant Concentrations and Manufacturing Method Thereof," which is a continuation of U.S. patent application Ser. No. 15/725,580, filed on Oct. 5, 2017, now U.S. Pat. No. 10,347,764 issued on Jul. 9, 2019, and entitled "Semiconductor Device with Multi-Layered Source/Drain Regions Having Different Dopant Concentrations and Manufacturing Method Thereof," which claims priority to U.S. Provisional Application No. 62/527,850, filed on Jun. 30, 2017, entitled "Semiconductor Device and Method," which applications are hereby incorporated by reference in their entireties.

TECHNICAL FIELD

The present invention relates generally to semiconductor device fabrication, and, in particular embodiments, to formation of contacts (also referred to as contact plugs) in semiconductor devices.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As transistor sizes decrease, the size of each feature decreases. In advance processing technologies, as the channel length of a transistor approaches the same order of magnitude as the depletion-layer widths, short-channel effect may appear, which may adversely affect the performance of the transistor. There is a need in the art for structures and processing methods that could accommodate the small feature sizes in advanced process technologies.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
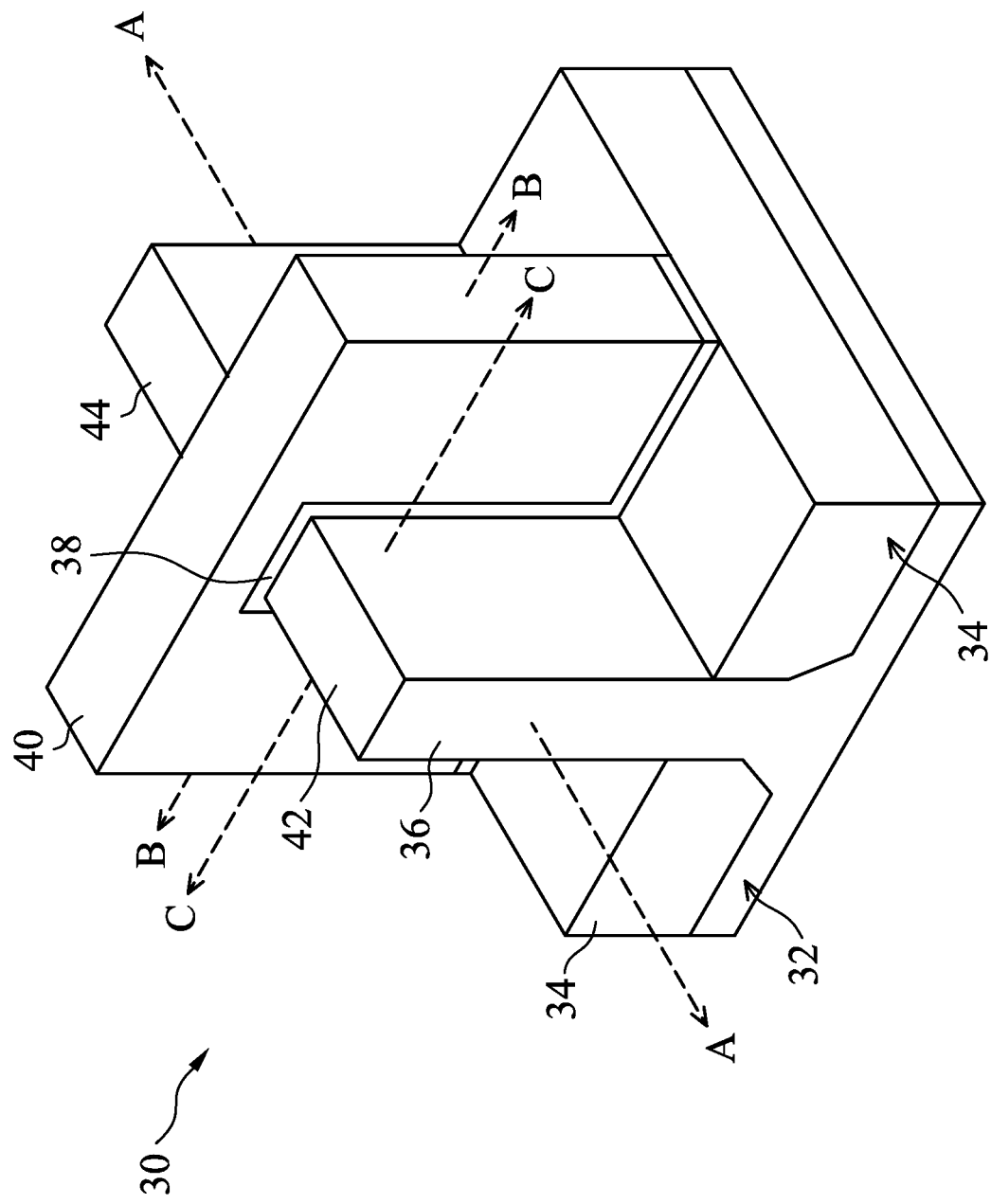
FIG. 1 is a perspective view of a Fin Field-Effect Transistor (FinFET)

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming source/drain regions of FinFET devices. However, one skilled in the art will readily appreciate that the methods disclosed in the present disclosure may be used in other devices or applications, e.g., planar devices.

FIG. 1 illustrates an example of a FinFET 30 in a perspective view. The FinFET 30 includes a substrate 32 having a fin 36. The substrate 32 has isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are in the fin on opposite sides of the gate dielectric 38 and gate electrode 40. FIG. 1 further illustrates reference cross-sections that are used in later figures. Cross-section B-B extends along a longitudinal axis of the gate electrode 40 of the FinFET 30. Cross-section C-C is parallel to cross-section B-B and is across a source/drain region 42. Cross-section A-A is perpendicular to cross-section B-B and is along a longitudinal axis of the fin 36 and in a direction of, for example, a current flow between the source/drain regions 42 and 44. Subsequent figures refer to these reference cross-sections for clarity.

FIGS. 2-17 are cross-sectional views of a FinFET device 100 at various stages of fabrication in accordance with an embodiment. The FinFET device 100 is similar to the FinFET 30 in FIG. 1, except for multiple fins. FIGS. 2-5 illustrate cross-sectional views of FinFET device 100 along cross-section B-B, and FIGS. 6-17 illustrate cross-sectional views along cross-section A-A.

Figure 2:
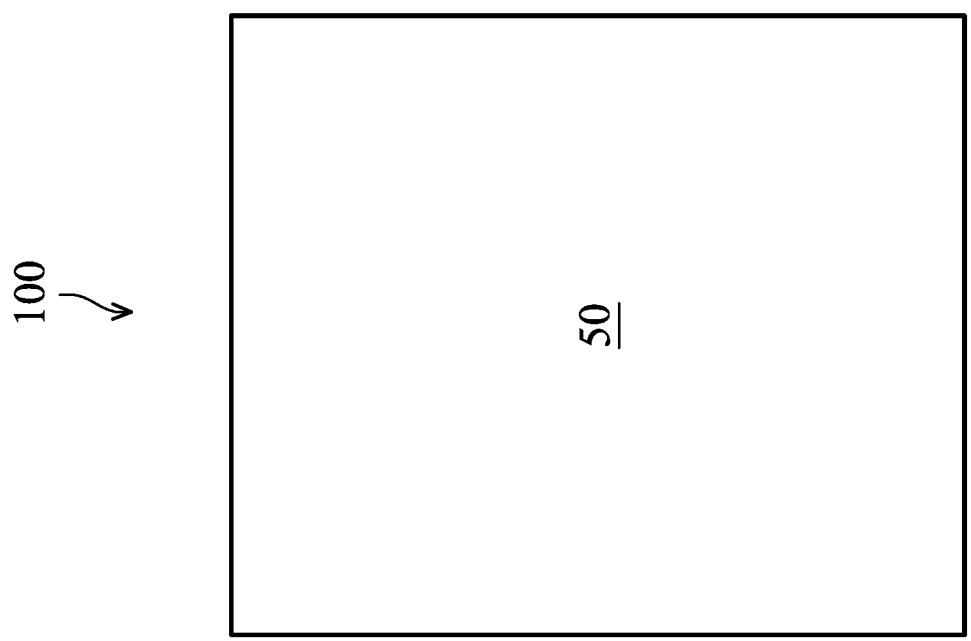
FIGS. 2-17 are cross-sectional views of a FinFET device at various stages of fabrication, in an embodiment.

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the FinFET. The integrated circuit devices may be formed using any suitable methods.

Figure 3:
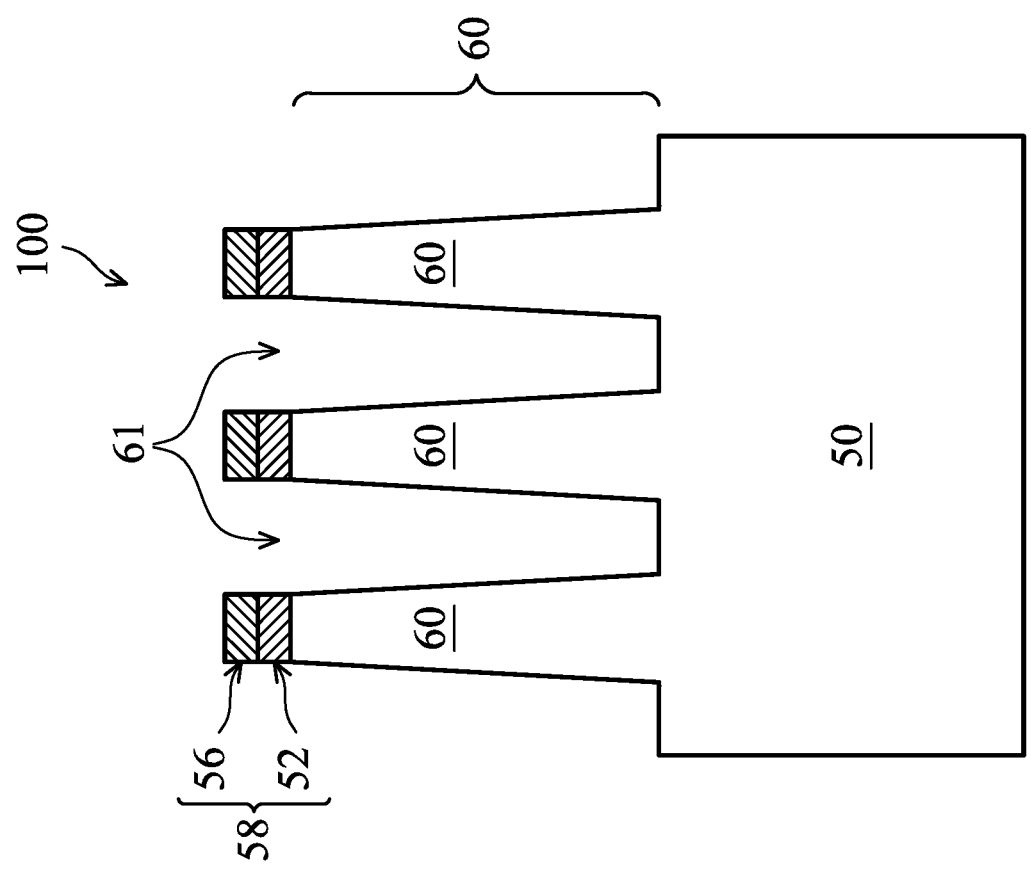

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride 56 to form a patterned mask 58, as illustrated in FIG. 3.

The patterned mask 58 is subsequently used to pattern exposed portions of the substrate 50 to form trenches 61, thereby defining semiconductor strips 60 between adjacent trenches 61 as illustrated in FIG. 3. In some embodiments, the semiconductor strips 60 are formed by etching trenches in the substrate 50. The etching may be any acceptable etch process, such as a reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor strips 60. After semiconductor strips 60 are formed, the patterned mask layer 58 may be removed by etching or any suitable method.

Figure 4:
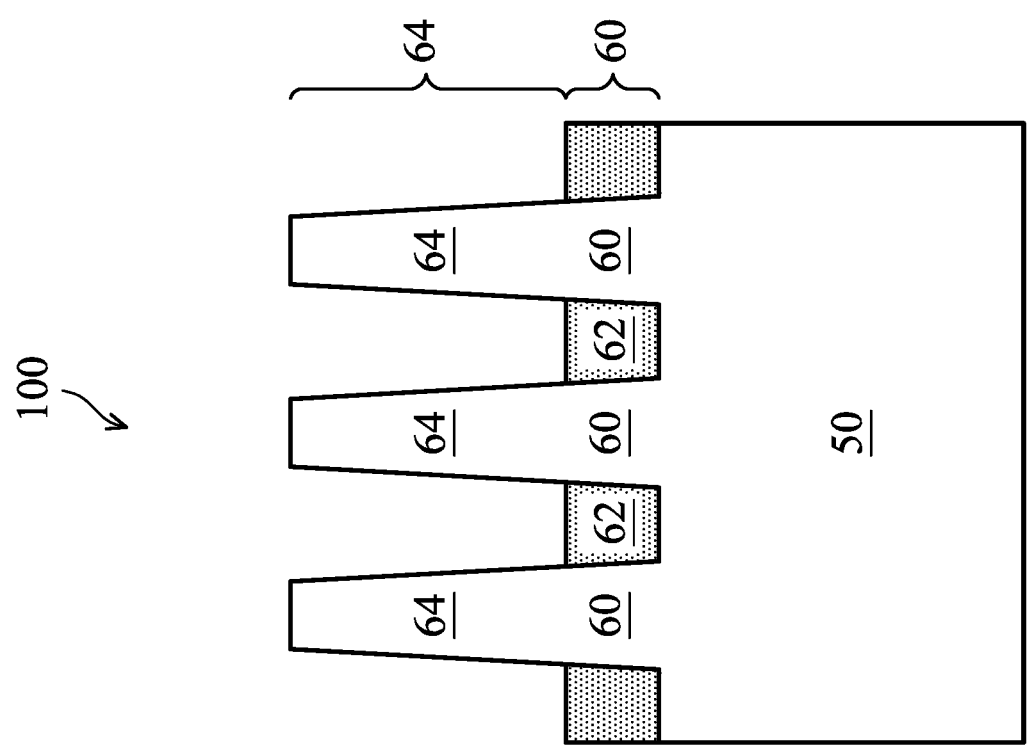

FIG. 4 illustrates the formation of an insulation material between neighboring semiconductor strips 60 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. A planarization process, such as a chemical mechanical polish (CMP), may remove any excess insulation material (and, if present, the patterned mask layer 58) and form top surfaces of the isolation regions 62 and top surfaces of the semiconductor strips 60 that are coplanar (not shown).

Next, the isolation regions 62 are recessed such as to form shallow trench isolation (STI) regions 62. The isolation regions 62 are recessed such that the upper portions of the semiconductor strips 60 protrude from between neighboring isolation regions 62 and form semiconductor fins 64 (also referred to as fins 64). The top surfaces of the isolation regions 62 may have a flat surface as illustrated, a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a chemical oxide removal using a CERTAS® etch or an Applied Materials SICONI tool or dilute hydrofluoric (dHF) acid may be used.

FIGS. 2 through 4 illustrate an embodiment of forming fins 64, but fins may be formed in various different processes. In one example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In another example, heteroepitaxial structures can be used for the fins. For example, the semiconductor strips can be recessed, and a material different from the semiconductor strips may be epitaxially grown in their place. In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
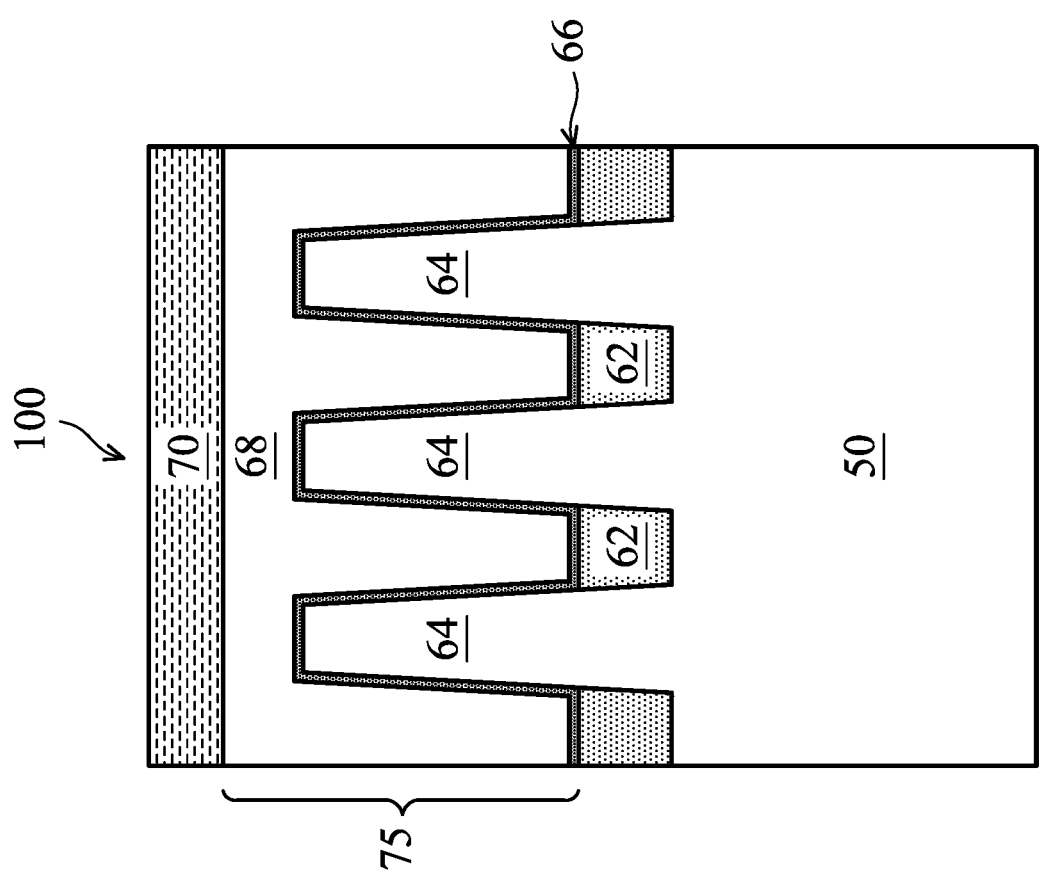

FIG. 5 illustrates the formation of gate structures 75 over the semiconductor fins 64. A dielectric layer is formed on the semiconductor fins 64 and the isolation regions 62. The dielectric layer may be, for example, silicon oxide, silicon nitride, multilayers thereof, or the like, and may be deposited or thermally grown according to acceptable techniques. In some embodiments, the dielectric layer is silicon dioxide (e.g., $SiO_2$). In some embodiments, the dielectric layer may be a high-k dielectric material, and in these embodiments, dielectric layer may have a k value greater than about 7.0, and may include a metal oxide or a silicate of Hf, Al, Zr, La, Mg, Ba, Ti, Pb, multilayers thereof, and combinations thereof. The formation methods of dielectric layer may include molecular-beam deposition (MBD), atomic layer deposition (ALD), PECVD, and the like.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. In some embodiments, the gate layer may include a metal-containing material such as TiN, TaN, TaC, Co, Ru, Al, AlTiC, AlTiN, AlTiO, W, combinations thereof, or multilayers thereof. The mask layer may be formed of, for example, silicon nitride or the like.

After the layers are formed, the mask layer may be patterned using acceptable photolithography and etching techniques to form mask 70. The pattern of the mask 70 then may be transferred to the gate layer and dielectric layer by an acceptable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64.

Figure 6:
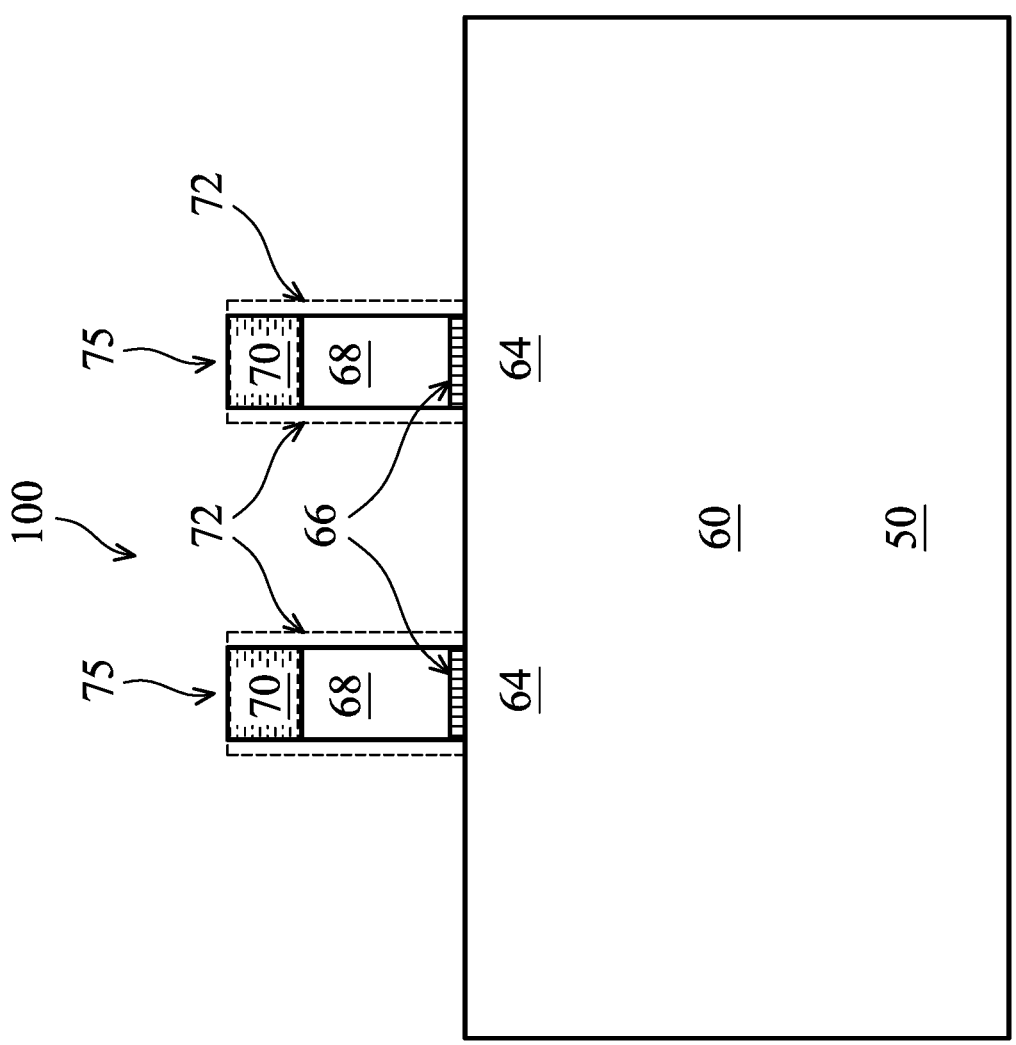

FIGS. 6-17 illustrate the cross-sectional views of the FinFET device 100 along cross-section A-A (along a longitudinal axis of the fin). Referring first to FIG. 6, two gate structures 75 are formed over a fin 64 as a non-limiting example. Other numbers of gate structures, e.g., more or less than two gate structures, may also be formed over the fin 64. As illustrated in FIG. 6, gate seal spacers (may also be referred to as spacers) 72 are optionally formed on sidewalls of the gate structures 75. The gate seal spacers 72 may be formed to prevent formation of semiconductor material 65' on the gate structures 75 (e.g., along the sidewalls or top surfaces of the gate structures 75) in subsequent processing (see FIG. 8), in some embodiments. In embodiments where the material(s) of the gate structures 75 is not conducive to the formation of the semiconductor material 65' thereon, the gate seal spacers 72 may be omitted. For simplicity, the gate seal spacers 72 are not illustrated in subsequent figures, with the understanding that the gate seal spacers 72 may be formed on the sidewalls of the gate structure 75.

The gate seal spacer 72 may be formed of a nitride, such as silicon nitride, silicon oxynitride, silicon carbide, silicon carbonitride, the like, or a combination thereof. In an exemplary embodiment, the gate seal spacers 72 are formed by first blanket depositing a gate seal spacer layer 72 over the isolation regions 62, the semiconductor fins 64, and the gate structures 75 using, e.g., a thermal oxidation or a suitable deposition process. Next, an anisotropic etching process (e.g., a plasma etching process) may be performed to remove portions of the gate seal spacer layer 72 disposed over upper surfaces of the isolation regions 62, the semiconductor fins 64, and the gate structures 75. After the anisotropic etching process, remaining portions of the gate spacer layer 72 on sidewalls of the gate structures 75 form the gate seal spacers 72.

Figure 7:
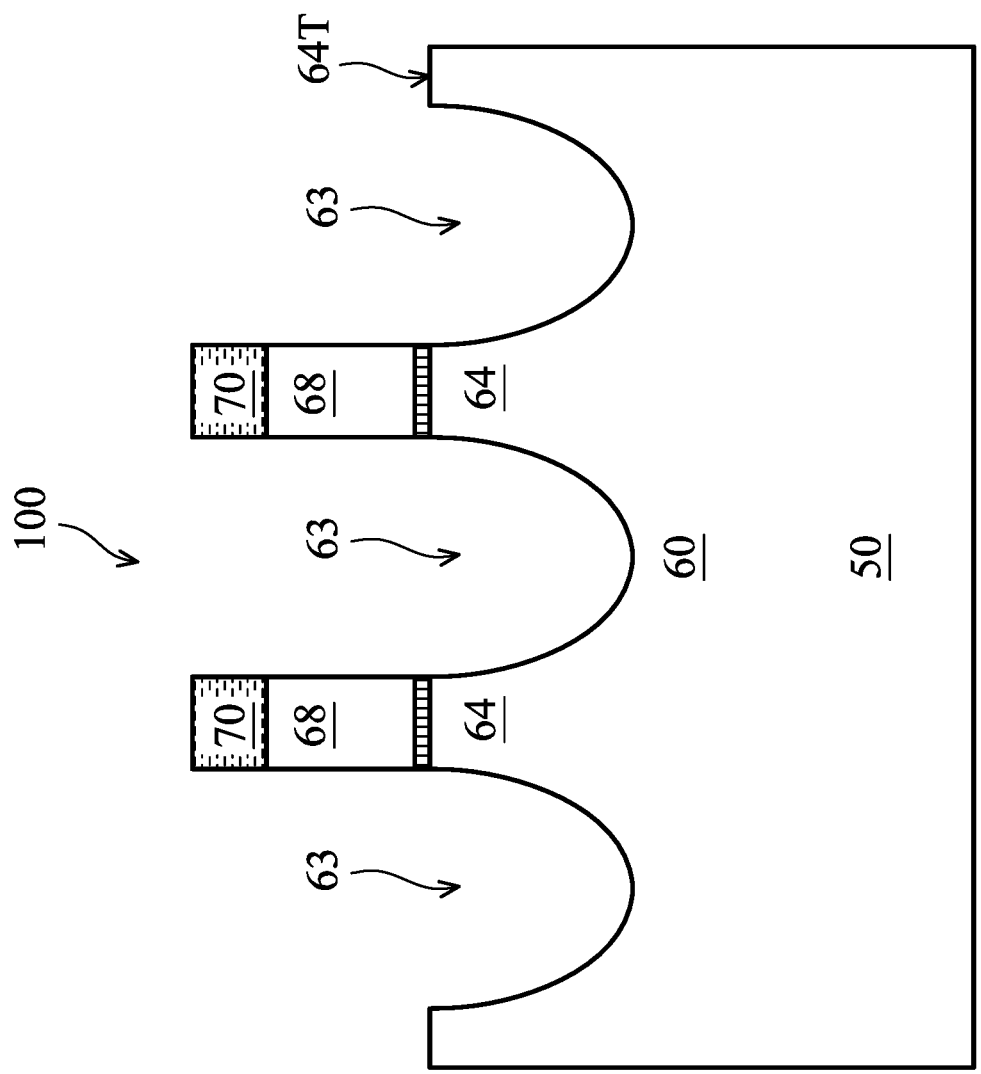

Next, as illustrated in FIG. 7, recesses 63 are formed in the fin 64. The recesses 63 are formed adjacent to the gate structures 75, and extend from an upper surface 64T of the fin 64 into the fin 64 in the illustrated embodiment. A patterned mask layer (not shown) may be used in a suitable etching process (e.g., a wet etch process) for forming the recesses 63. After the recesses 63 are formed, the patterned mask layer is removed using a suitable removal process such as ashing.

Figure 8:
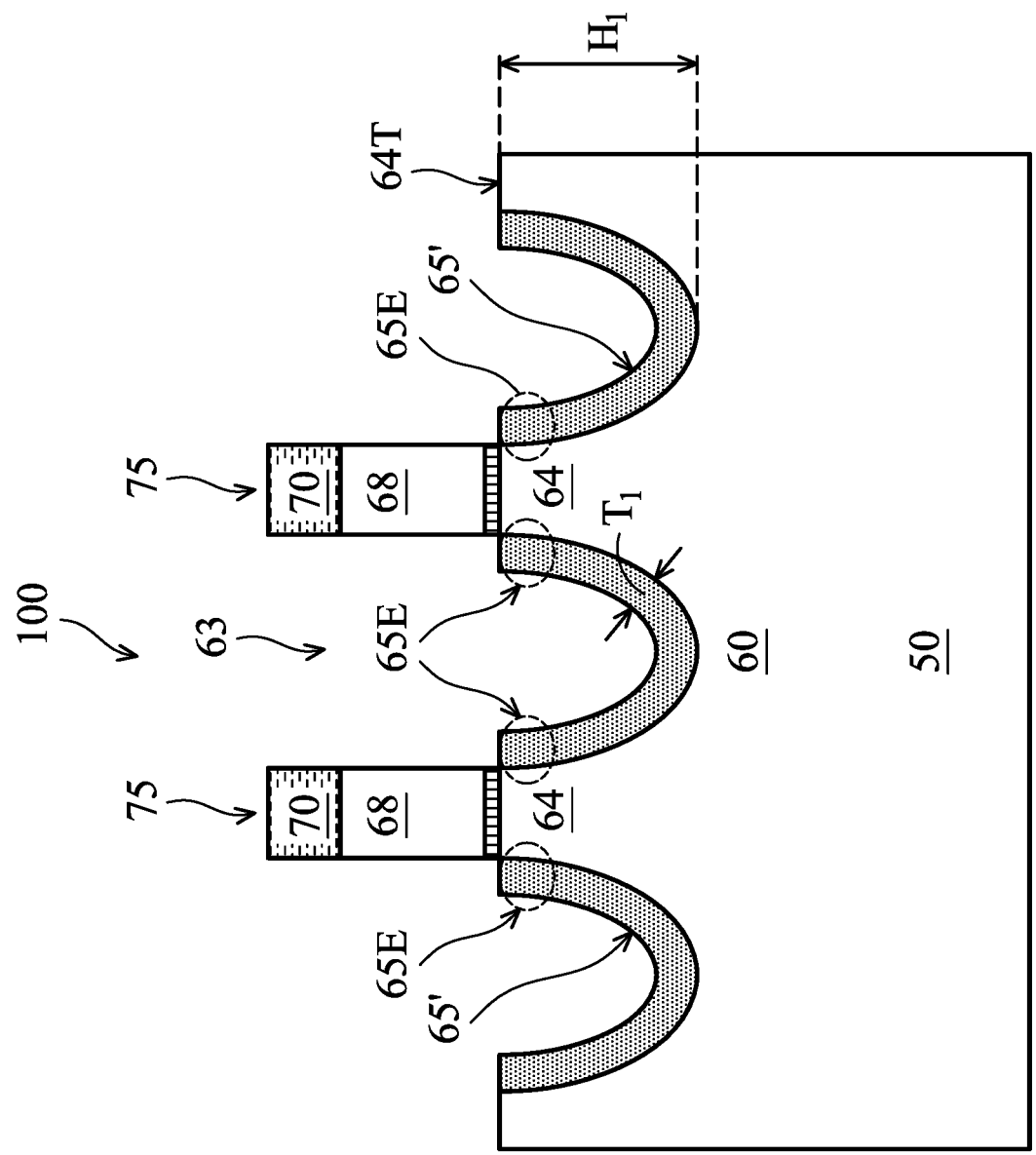

Referring now to FIG. 8, a semiconductor material 65' is formed in the recesses 63. The semiconductor material 65' may comprise a suitable material (e.g., silicon/carbide, or silicon/germanium) for the type of semiconductor devices (e.g., N-type devices or P-type devices) to be formed. The suitable material may provide a compressive stress for improving the mobility of holes in P-type devices, or provide a tensile stress for improving the mobility of electrons in N-type devices. The semiconductor material 65' may include a suitable dopant, e.g., N-type dopant such as phosphorous (P) or P-type dopant such as boron (B), for the type of semiconductor devices to be formed. For example, in embodiments where N-type devices are to be formed, the semiconductor material 65' may comprise silicon phosphorus (SiP). As another example, in embodiments where P-type devices are to be formed, the semiconductor material 65' may comprise silicon germanium (SiGe), or SiGe doped with boron (B). Note that phosphorous and boron are used as examples of N-type dopant and P-type dopant, respectively, in the above discussion. Other suitable N-type dopant or P-type dopant may also be used and are fully intended to be included within the scope of the present disclosure.

In some embodiments, the semiconductor material 65' is formed by epitaxially growing a material in the recesses 63, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. In an exemplary embodiment for N-type devices, the semiconductor material 65' is formed using a first precursor containing silicon and a second precursor containing phosphorous. The first precursor may include dichlorosilane (DCS), silazane, the like, or combinations thereof. The second precursor may include phosphine ($PH_3$), or the like. The epitaxially growth process may be performed at a temperature between about 400 C.° and about 700 C.°. A pressure of the epitaxially growth process may be between about 5 torr and about 600 torr. A flow rate for the silicon-containing first precursor may be between about 50 standard cubic centimeter per minute (sccm) to about 1000 sccm, and a flow rate for the phosphorous-containing second precursor may be between about 20 sccm to about 300 sccm.

As illustrated in FIG. 8, the semiconductor material 65' is conformally formed in the recesses 63. The semiconductor material 65' lines the sidewalls and the bottoms of recesses 63, in some embodiments. In accordance with some embodiments, a thickness $T_1$ of the semiconductor material 65' ranges from about 1 nm to about 10 nm, and a height $H_1$ (e.g., from a bottom-most surface of the semiconductor material 65' to a top-most surface of the semiconductor material 65') of the semiconductor material 65' ranges from about 30 nm to about 80 nm. Other dimensions are also possible, and may be determined by design requirements of the semiconductor devices. As illustrated in FIG. 8, portions 65E of the semiconductor material 65' are proximate to (e.g., level with) the top surface 64T of the fin 64, and abut the gate structures 75. The portions 65E may be referred to as the end portions of the semiconductor material 65' hereinafter.

Figure 9:
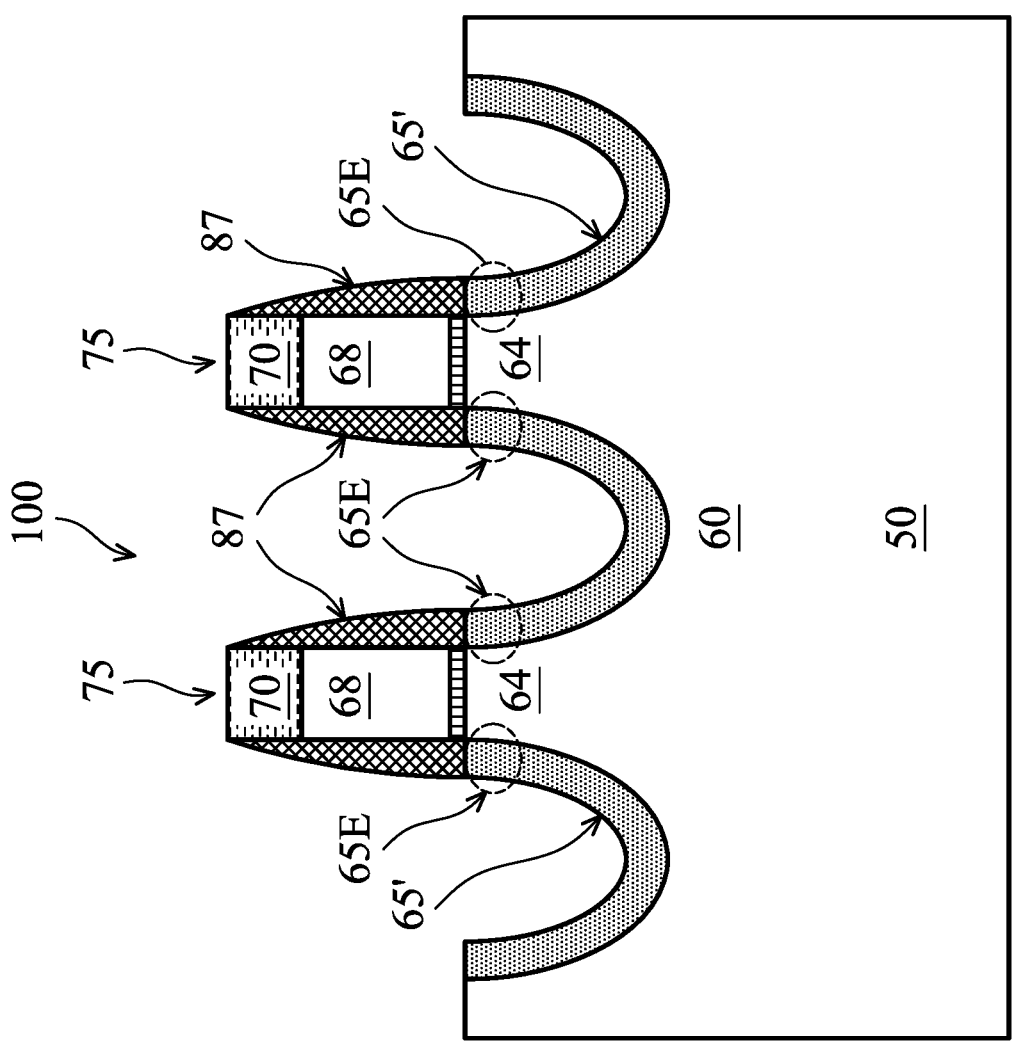

Next, as illustrated in FIG. 9, first spacers 87 are formed on the sidewalls of gate structures 75. The first spacer 87 may be formed of a nitride, such as silicon nitride, silicon oxynitride, silicon oxide, silicon carbide, silicon carbonitride, the like, or a combination thereof, and may be formed using, e.g., a thermal oxidation or a suitable deposition process, such as physical vapor deposition (PVD), chemical vapor deposition (CVD), or the like. The first spacers 87 may be formed by first blanket depositing a first spacer layer 87 over the semiconductor device 100, then performing an isotropic etching to remove portions of the deposited first spacer layer 87 over upper surfaces of the gate structures 75 and over upper surfaces of the semiconductor material 65'. A plasma etching process using HF or HCl may be used for the anisotropic etching. The first spacers 87 are removed and replaced by second spacers 89 in subsequent processing (see FIGS. 11 and 12), therefore, the first spacers 87 may also be referred to as dummy spacers 87 in the present disclosure.

As illustrated in FIG. 9, the dummy spacers 87 are formed over end portions 65E of the semiconductor material 65'. The dummy spacers 87 are formed of a sufficient width to cover the end portions 65E of the semiconductor material 65', in some embodiments. The dummy spacers 87 shields the end portions 65E from a subsequent etching process such that the end portions 35E are etched less than other portions of the semiconductor material 65', as described in more details hereinafter.

A cleaning process may be performed after the dummy spacers 87 are formed. A suitable cleaning process, such as a plasma process using a gas comprising HF or HCl, may be performed to remove the material of the dummy spacers 87 from locations other than the sidewalls of the gate structures 75, such as on the upper surface of the semiconductor material 65'.

Figure 10:
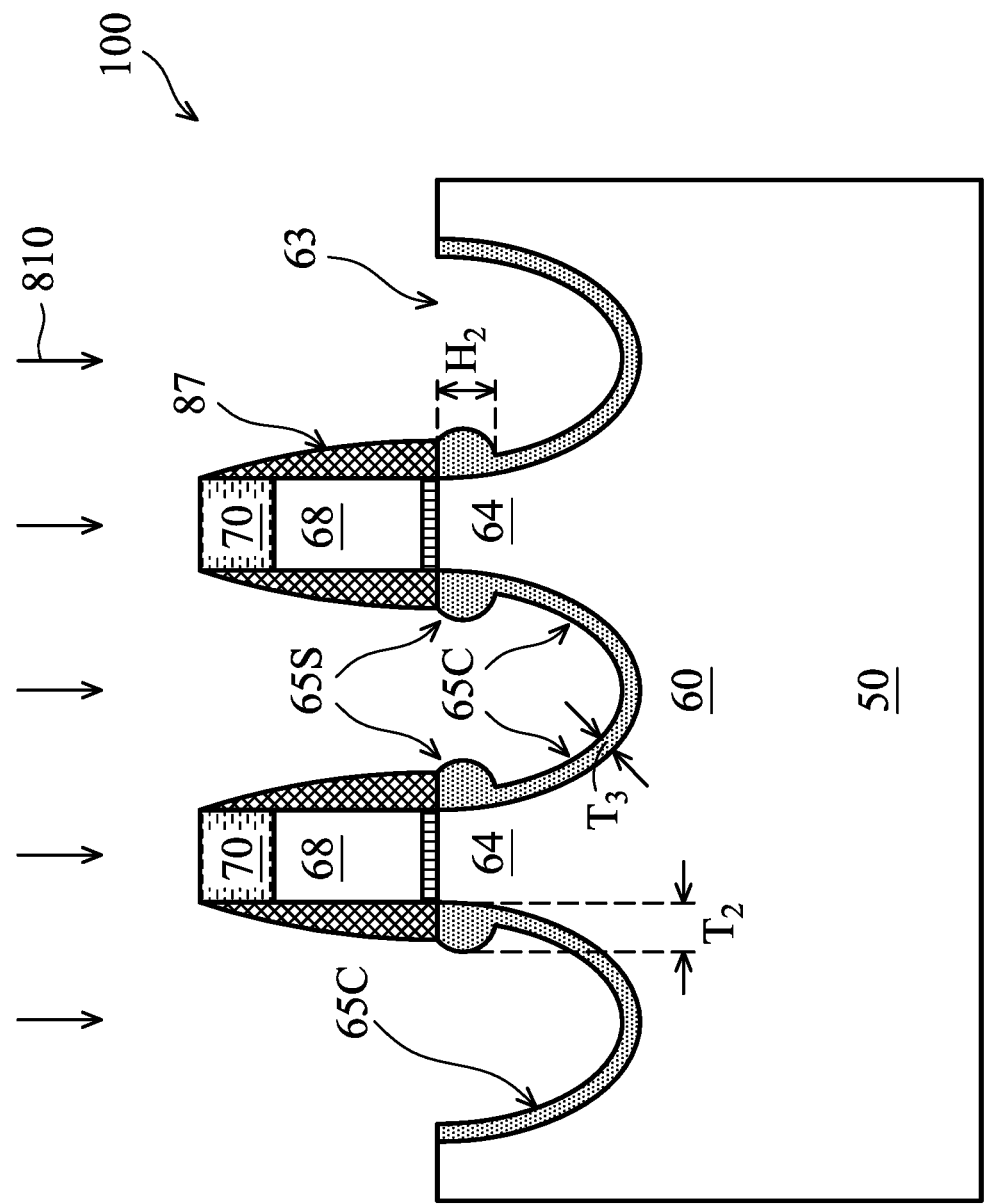

Next, as illustrated in FIG. 10, an etching process 810 is performed. The etching process 810 removes an upper layer of the semiconductor material 65', and a remaining lower layer of the semiconductor material 65' forms a first semiconductor layer 65 (e.g., 65S and 65C).

In some embodiments, the etching process 810 is a dry etching process. The dry etching process is a plasma process using a gas comprising $CF_4$ and $O_2$, in some embodiments. A pressure of the dry etching process may be between about 10 torr to about 300 torr. Since the dummy spacers 87 shield the end portions 65E (see FIG. 9) of the semiconductor material 65' from the etching process 810, the end portions 65E are etched less than other portions of the semiconductor material 65'. For example, portions of the semiconductor material 65' other than the end portions 65E (e.g., portions in a recess 63 extending between two corresponding end portions 65E, or portions disposed between an end portions 65E and a bottom of a corresponding recess 63) are removed at a faster rate than the end portions 65E during the etching process 810. As a result, remaining portions of the end portions 65E after the etching process 810 form first portions 65S. As illustrated in FIG. 10, each of the first portions 65 has at least portions of a round or oval shape with a substantially flat top surface. FIG. 10 illustrates a non-limiting example of the shape of the first portions 65, other shapes for the first portions 65 are also possible (e.g., see FIGS. 18 and 19), as will be described hereinafter. The first portions 65S have a thickness $T_2$ that is larger than a thickness $T_3$ of other portions 65C (e.g., portions of 65 other than the first portions 65S) of the first semiconductor layer 65. In some embodiments, the thickness $T_2$ is in a range from about 1 nm to about 5 nm, the thickness $T_3$ is in a range from about 1 nm to about 5 nm, with $T_2$ greater than $T_3$. A height $H_2$ of the first portions 65S may be between about 5 nm and about 20 nm, in the illustrated embodiment.

Figure 18:
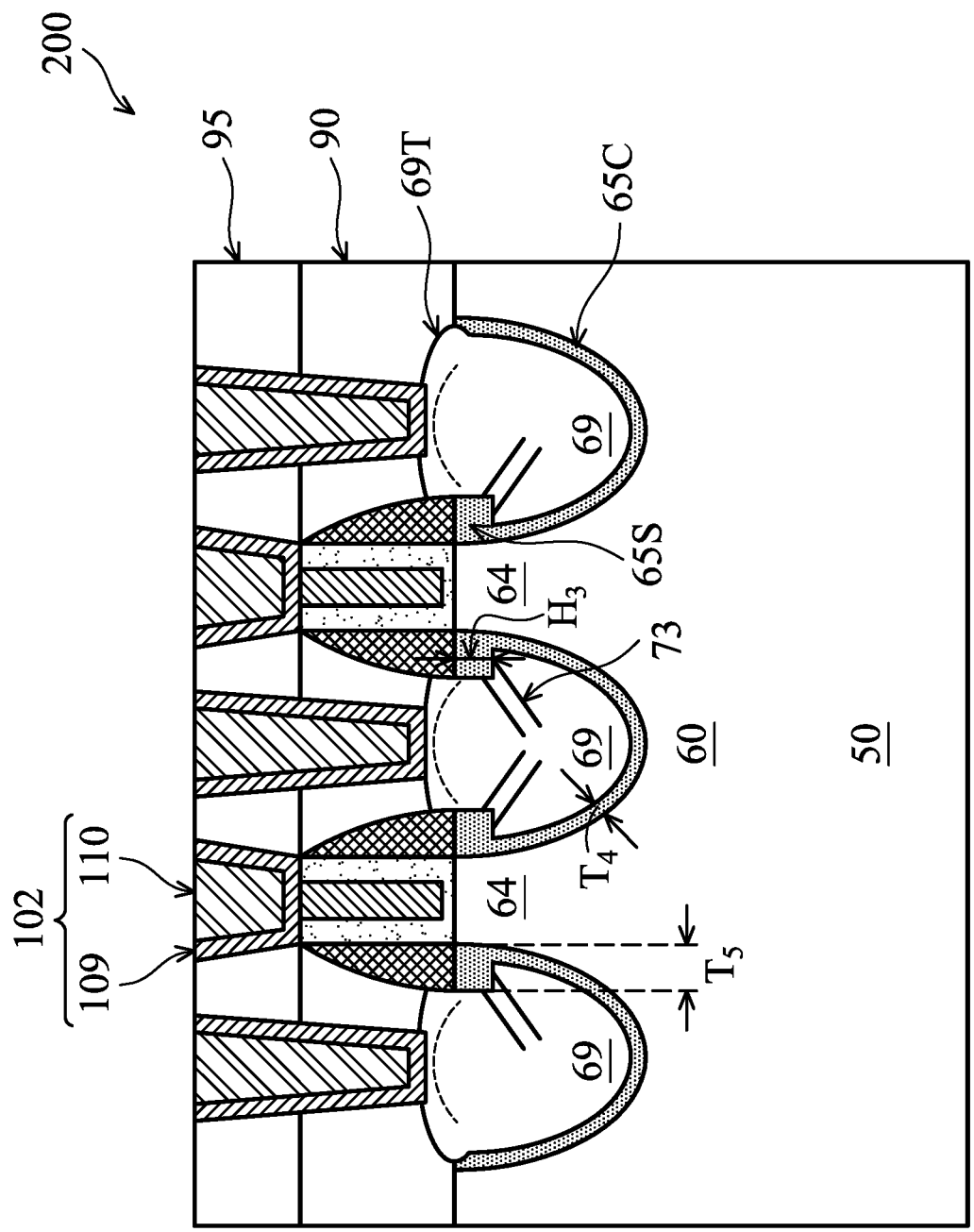
FIG. 18 is the cross-sectional views of a FinFET device, in an embodiment.
Figure 19:
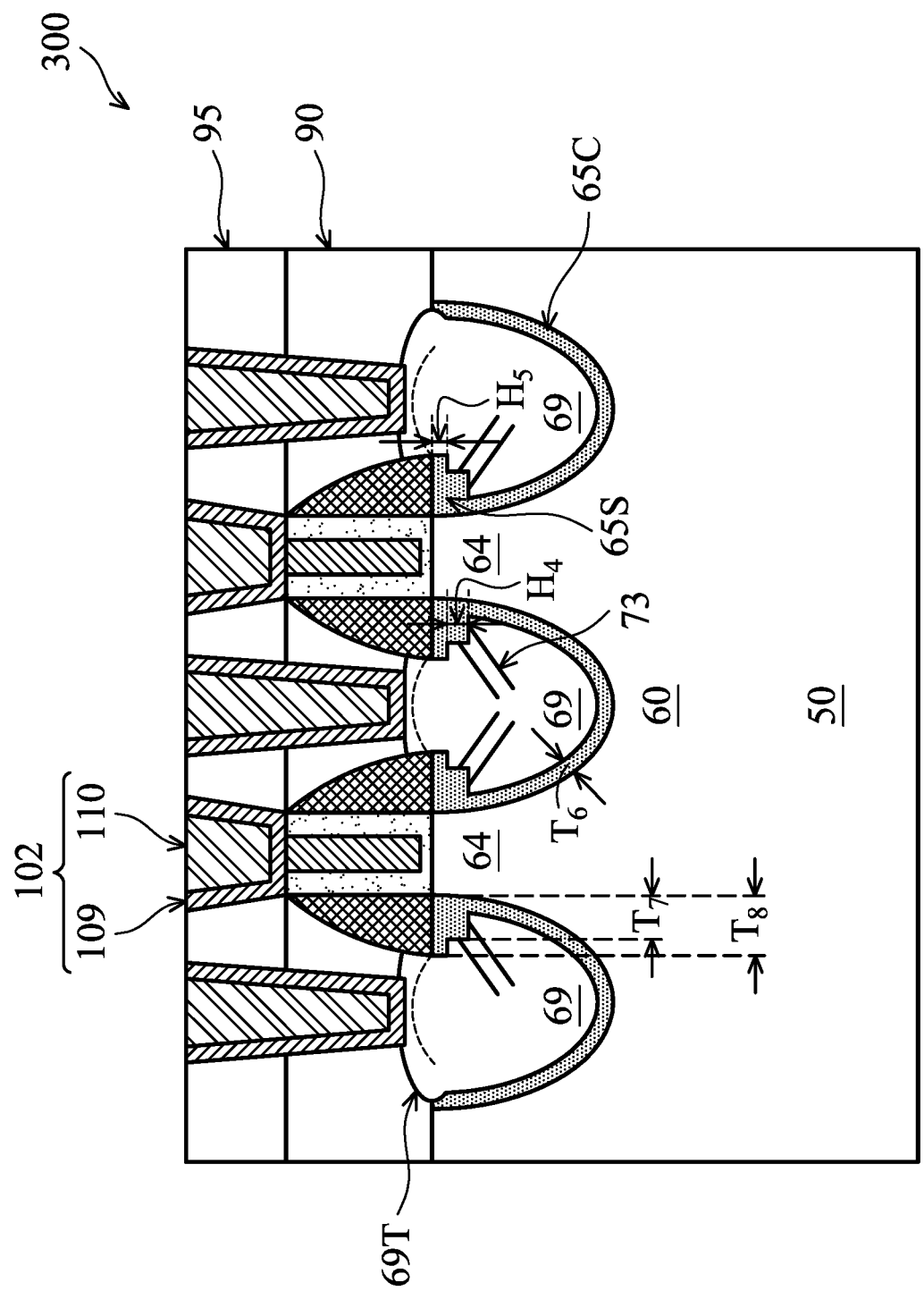
FIG. 19 is the cross-sectional views of a FinFET device, in an embodiment.

In accordance with some embodiments, the pressure of the etching process is adjusted to achieve a target etch rate in a lateral direction (e.g., direction from the left to the right in FIG. 10). The pressure of the etching process or the size (e.g., width) of the dummy spacer 87 may be adjusted to control the shape/size of the first portions 65S of the first semiconductor layer 65. The example of FIG. 10 shows the first portions 65S as having at least portions of a round/oval shape, and the other portions 65C as being conformal to the recess 63. As illustrated in FIG. 10, the other portions 65C have a substantially uniform thickness $T_3$. The shape and/or dimensions of the first semiconductor layer 65 (e.g., 65S and 65C) in FIG. 10 is a non-limiting example, other shapes or dimensions are also possible and are fully intended to be included within the scope of the present disclosure. For example, FIGS. 18 and 19 illustrate other shapes or sizes for the first semiconductor layer 65, which will be described hereinafter.

Figure 11:
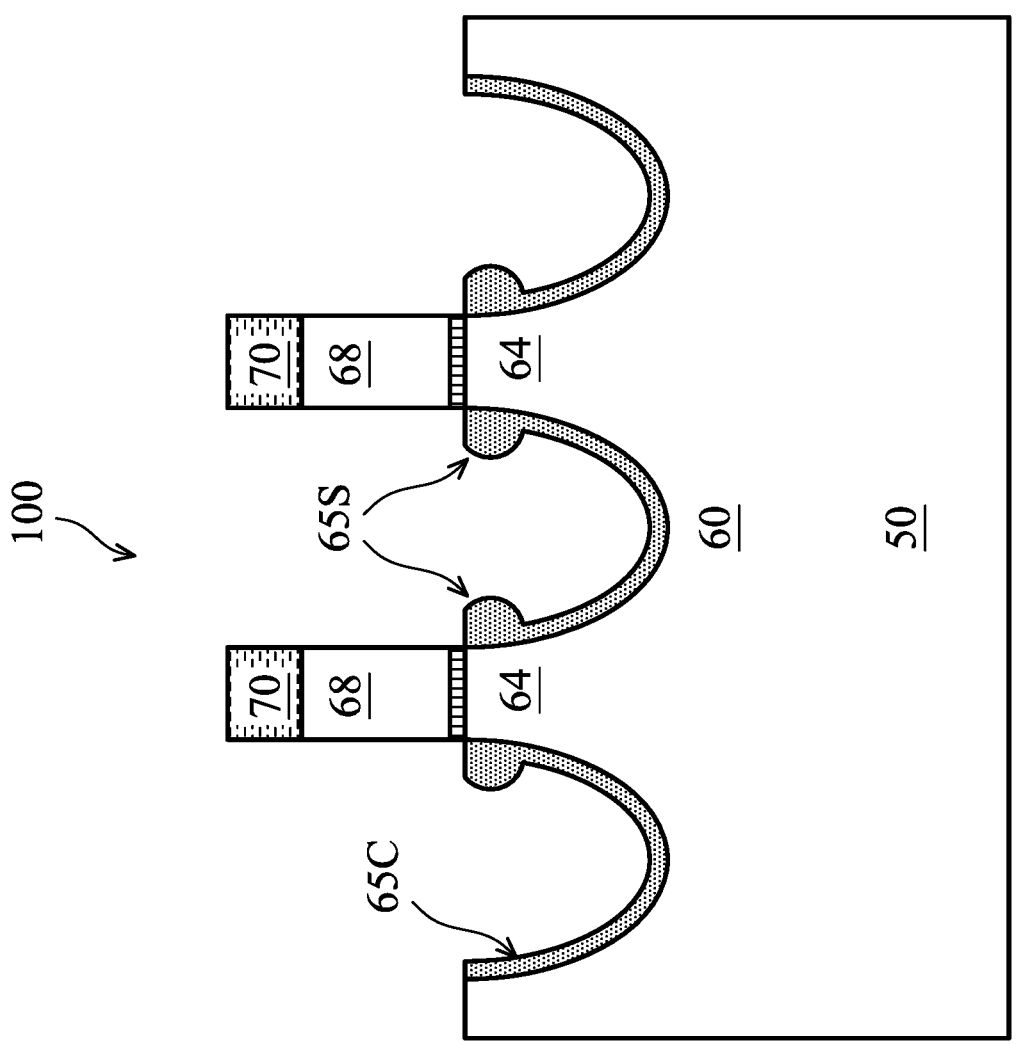
Figure 12:
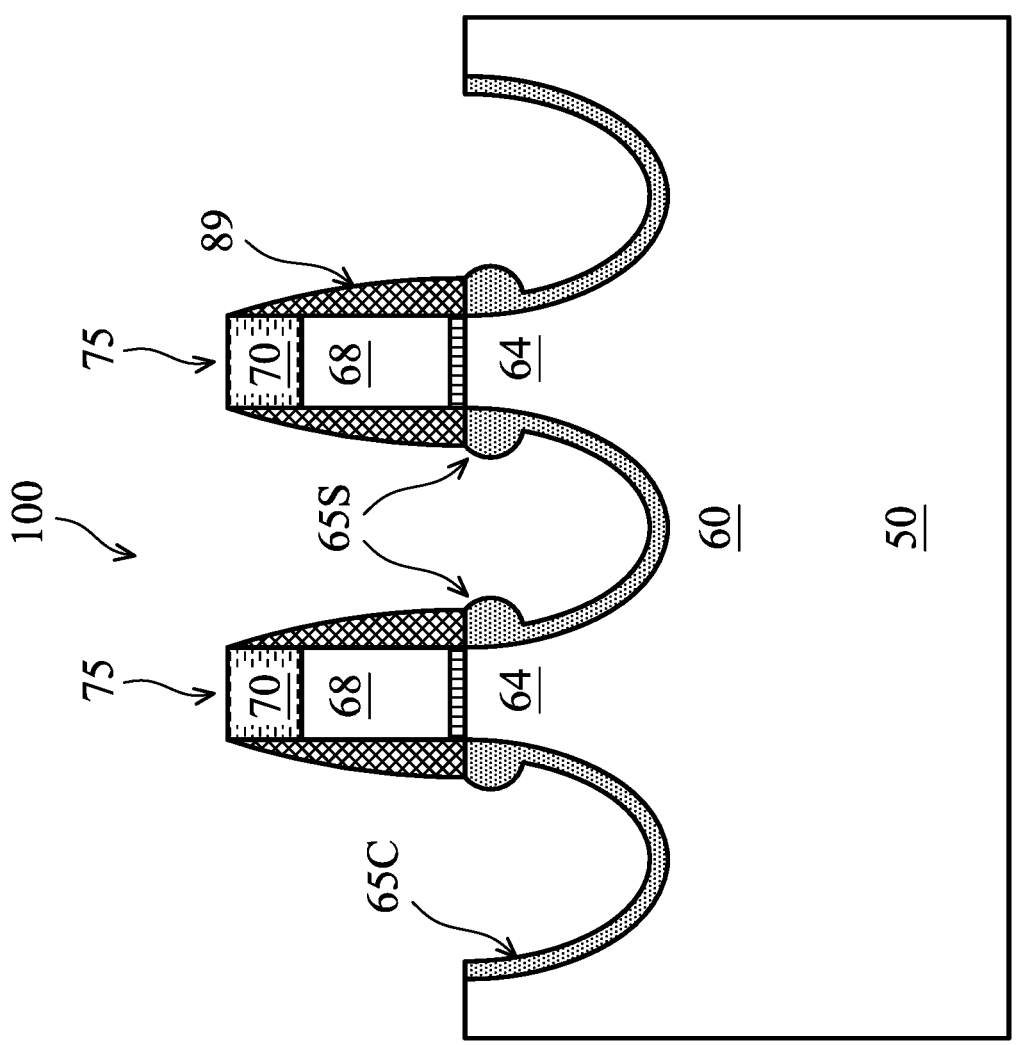

The dummy spacers 87 may be damaged by the etching process 810, therefore, after the etching process 810 is finished, the dummy spacers 87 are removed and replaced by second spacers 89, as illustrated in FIGS. 11 and 12.

Referring to FIG. 11, the dummy spacers 87 are removed. The dummy spacer 87 may be removed by a suitable removal process, such as an etching process. In some embodiments, a wet etching process is performed to remove the dummy spacers 87. For example, a wet etching process using an etchant comprising HF, or a mixture of HF and HCl, may be used to remove the dummy spacers 87.

Next, as illustrated in FIG. 12, second spacers 89 are formed on sidewalls of the gate structures 75. The material and formation method of the second spacers 89 may be similar to those of the dummy spacers 87, thus details are not repeated. In other embodiments, the second spacers 89 comprise a different material than the dummy spacers 87, and may be formed using suitable formation methods such as CVD, PVD, the like, or combinations thereof. The dimensions (e.g., width) of the second spacers 89 may be similar to those of the dummy spacers 87, although different dimensions may also be used. After the second spacers 89 are formed, the first portions 65S of the first semiconductor layer 65 are covered by the second spacers 89, as illustrated in FIG. 12.

Figure 13:
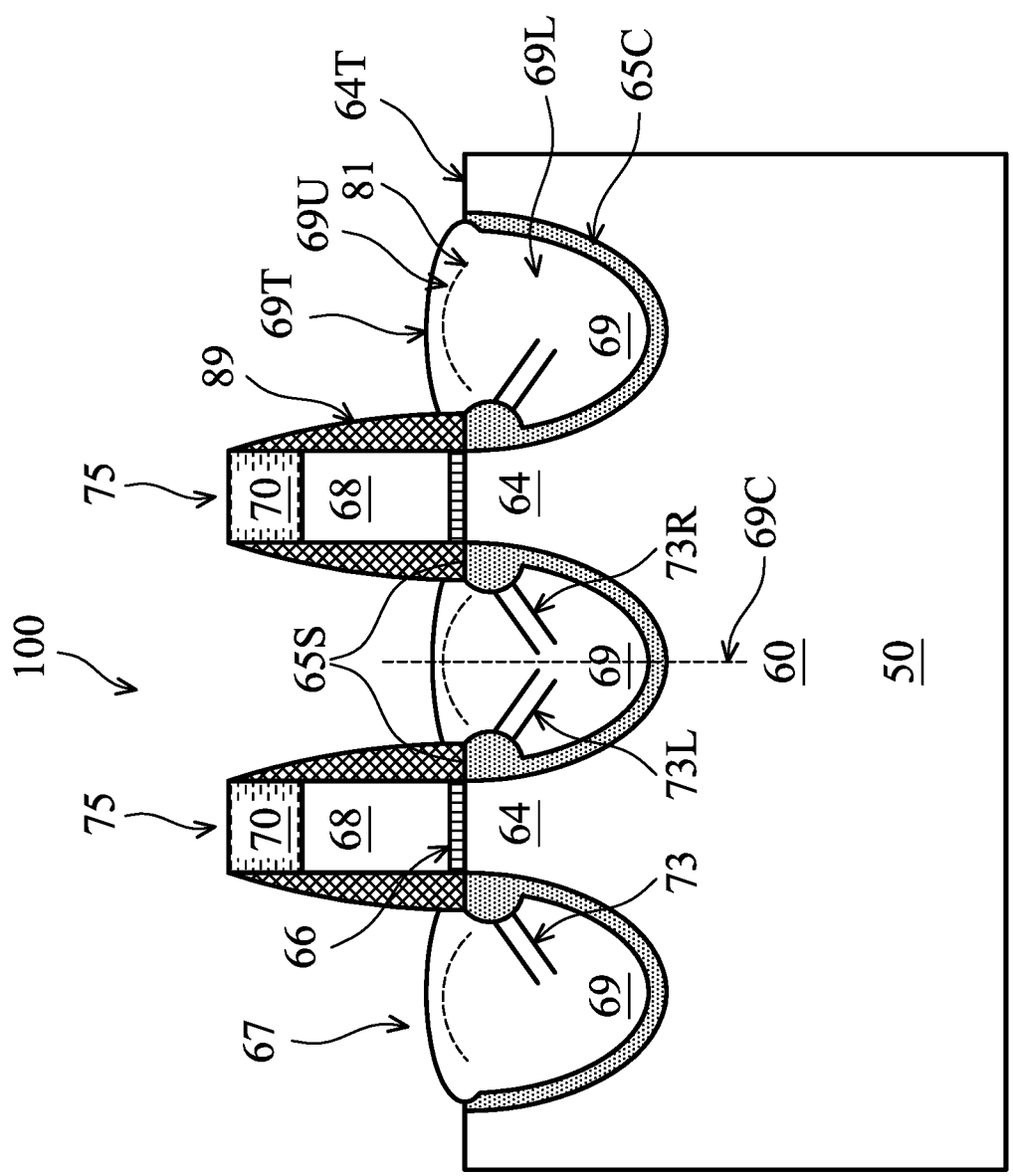

Next, in FIG. 13, a second semiconductor layer 69 is formed over the first semiconductor layer 65. The second semiconductor layer 69 fills the recesses, as illustrated in FIG. 13. A top surface 69T of the second semiconductor layer 69 may extend above the top surface 64T of the fin 64. The first semiconductor layer 65 and the second semiconductor layer 69 form source/drain regions 67 of semiconductor device 100, in the illustrated embodiment.

In an exemplary embodiment, a material of the second semiconductor layer 69 comprises the same elements (e.g., silicon, phosphorus) as a material of the first semiconductor layer 65, but with different concentrations. In the illustrated embodiment, the second semiconductor layer 69 has a higher concentration of dopant (e.g., phosphorous, or boron) than the first semiconductor layer 65. For example, an atomic percentage of the dopant (e.g., phosphorous, or boron) in the second semiconductor layer 69 may be ten times or more than that of the first semiconductor layer 65. In some embodiments, the atomic percentage of the dopant in the second semiconductor layer 69 is between 10 times to 100 times that of the first semiconductor layer 65. As a non-limiting example, the atomic percentage of the dopant (e.g., phosphorous, or boron) in the first semiconductor layer 65 may be between 1E18 atoms/cm$^3$ to about 9E20 atoms/cm$^3$, and the atomic percentage of the dopant (e.g., phosphorous, or boron) in the second semiconductor layer 69 may be between 1E19 atoms/cm$^3$ to about 8E21 atoms/cm$^3$.

In some embodiments, the second semiconductor layer 69 is formed using the same precursors as in the formation of the semiconductor material 65', but with the process conditions (e.g., flow rate for one or more of the precursors) adjusted to achieve different dopant concentrations. For example, the flow rate of the second precursor (e.g., the second phosphorous-containing precursor) may be increased during the formation of the second semiconductor layer 69 to achieve a higher dopant concentration (e.g., atomic percentage) in the second semiconductor layer 69.

As illustrated in FIG. 13, dislocations 73 are formed in the source/drain regions 67, e.g., proximate the first portions 65S. Dislocations 73 are formed due to the first semiconductor layer 65 being non-conformal (e.g., due to the first portions 65S being thicker than the other portions 65C of the first semiconductor layer 65), in some embodiments. Dislocations 73 may extend from the first portion 65S toward a center axis 69C of the second semiconductor layer 69. Corresponding dislocations 73, e.g., a dislocation 73L and a corresponding dislocation 73R, in inner source/drain regions 67 (e.g., source/drain regions 67 disposed between two adjacent gate structures 75) may form a V-shape, as illustrated in FIG. 13. In some embodiments, the dislocations 73 in the outer source/drain regions 67 (e.g., source/drain regions 67 that are not disposed between two adjacent gate structures 75) do not form V-shapes, because only one first portion 65S is formed in the first semiconductor layer 65 in the outer source/drain regions 67.

In accordance with some embodiments, an upper portion 69U of the second semiconductor layer 69 has a higher (e.g., higher by about 10% to about 50%) dopant concentration than that of a lower portion 69L of the second semiconductor layer 69. A boundary 81 between the upper portion 69U and the lower portion 69L is at about the same level as the upper surface 64T of the fin 64, in some embodiments. Therefore, the upper portion 69U may comprise portions of the second semiconductor layer 69 that are above the upper surface 64T of the fin 64, and the lower portion 69L may comprise portions of the second semiconductor layer 69 that are below the upper surface 64T of the fin 64. The upper portion 69U may be formed by adjusting the process condition (e.g., flow rate of one or more precursors) during the final stage of the formation of the second semiconductor layer 69, e.g., by increasing the flow rate of the second dopant-containing precursor. In other embodiments, the second semiconductor layer 69 has a substantially uniform concentration, and is formed by using a same process condition until the second semiconductor layer 69 fills the recesses 63 and reaches a target height or volume, in which case the upper portion 69U and the lower portion 69L have a same composition.

As illustrated in FIG. 13, the epitaxial source/drain regions 67 may have surfaces raised from the top surface 64T of the fin 64 (e.g., raised above the non-recessed portions of the fins 64) and may have facets. The source/drain regions 67 of the adjacent fins 64 may merge to form a continuous epitaxial source/drain region 67. In some embodiments, the source/drain regions 67 for adjacent fins 64 do not merge together and remain separate source/drain regions 67. In some exemplary embodiments in which the resulting FinFET is an n-type FinFET, source/drain regions 67 comprise silicon carbide (SiC), silicon phosphorous (SiP), phosphorous-doped silicon carbon (SiCP), or the like. In alternative exemplary embodiments in which the resulting FinFET is a p-type FinFET, source/drain regions 67 comprise SiGe, and a p-type impurity such as boron or indium. Although not shown in FIG. 13, a silicon capping layer may be formed over the epitaxial source/drain regions 67 using, e.g., CVD, PVD, or other suitable formation method.

The non-conformal first semiconductor layer 65 of the FinFET device 100 may help to reduce current leakage from a subsequently formed metal gate (e.g., metal gate 97 in FIG. 15) to the source/drain regions (e.g., source/drain region 67). The non-conformal first semiconductor layer 65 may also create a depletion region under the drain, thus lowering the potential barrier from the source to channel junction. Semiconductor devices formed in accordance with the disclosed device structure may improve device performance in terms of threshold voltage $V_t$ (e.g., by lowing the $V_t$), thus helping to alleviate the short channel effect. The disclosed device structure may also help to balance trade-offs between the speed and the power consumption of the formed devices. For example, at a given power consumption constraint, higher speed of the device can be achieved.

Figure 14:
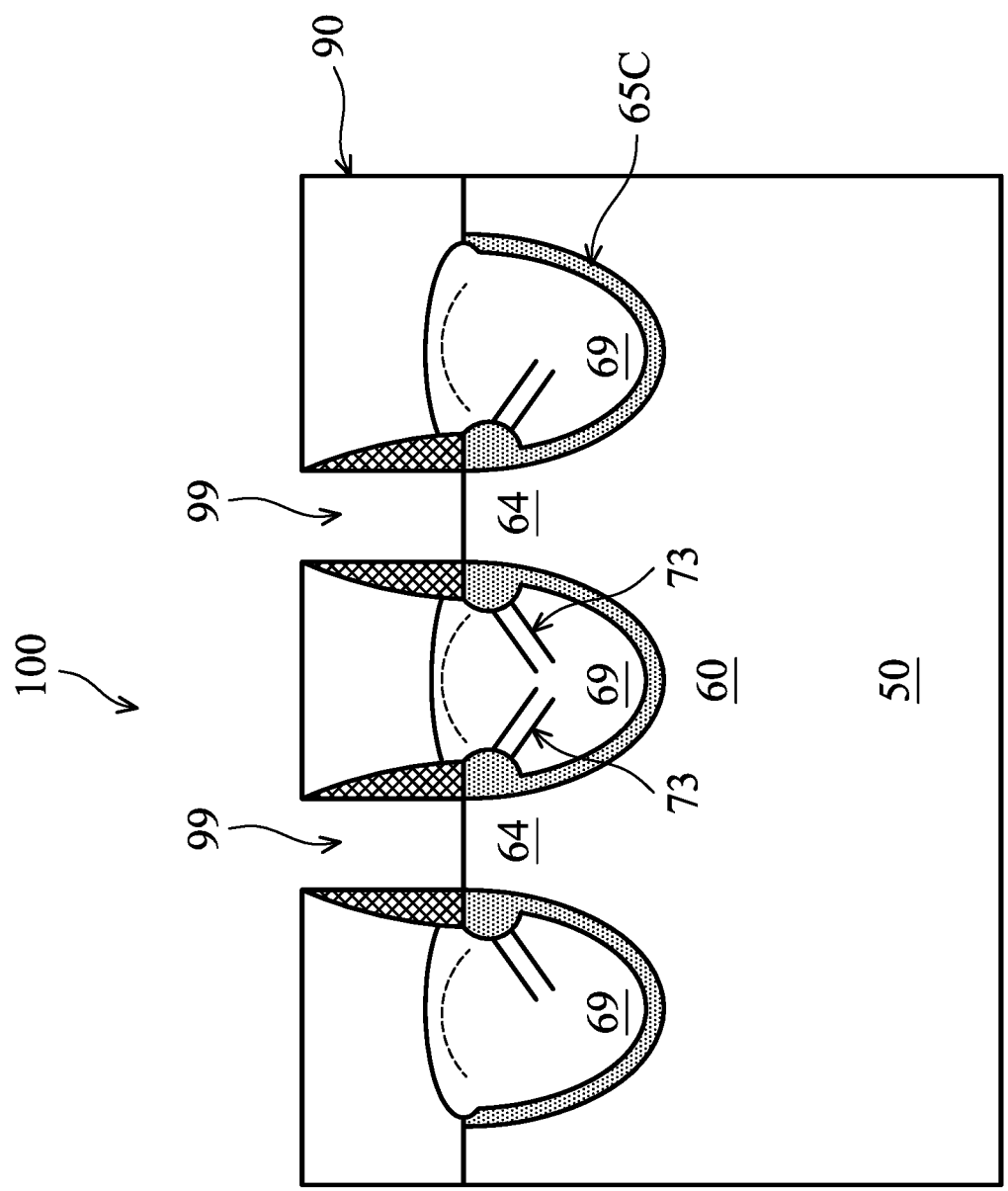
Figure 15:
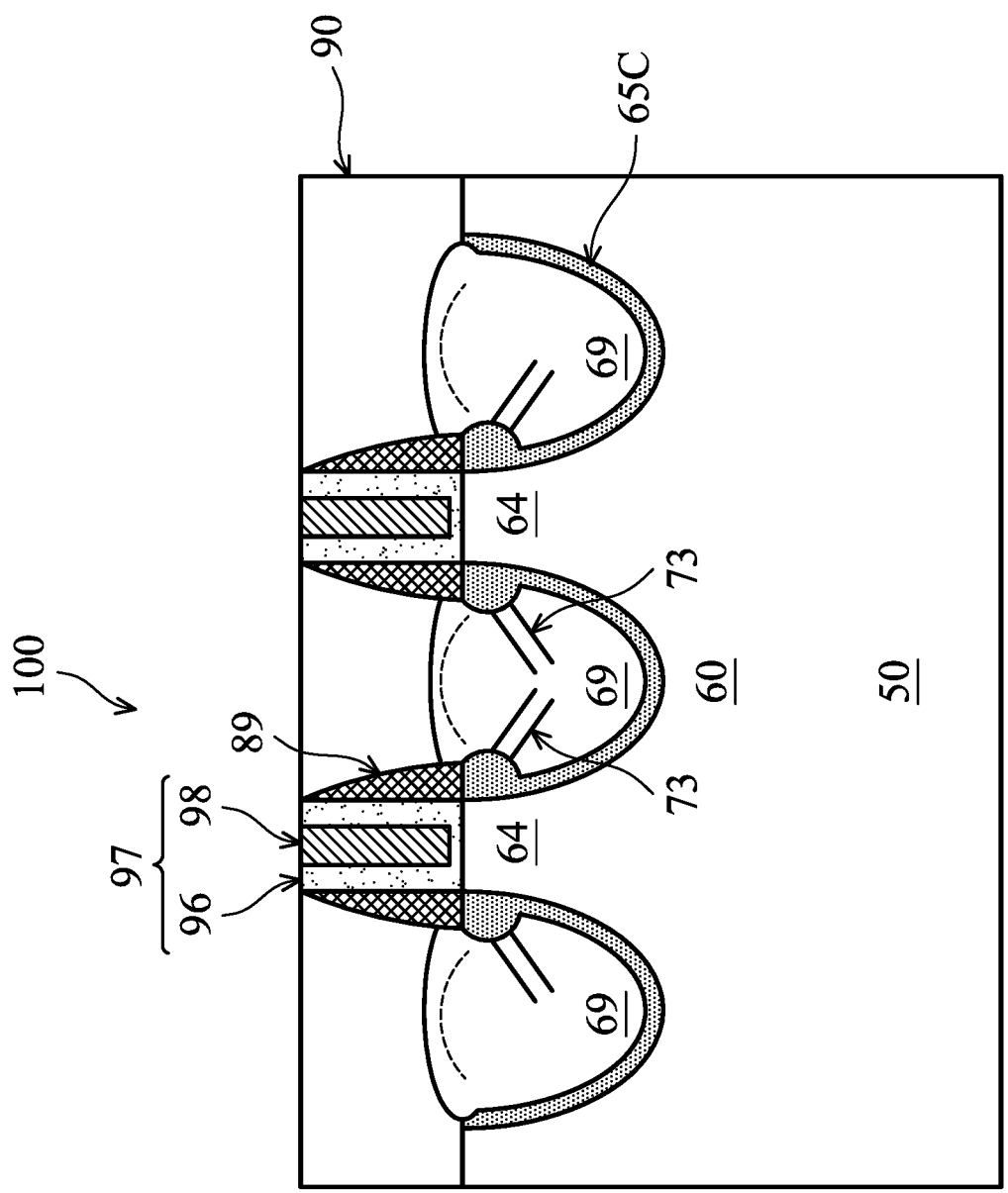

Next, as illustrated in FIGS. 14 and 15, a gate-last process (sometimes referred to as replacement gate process) is performed. In a gate-last process, the gate 68 and the gate dielectric 66 (see FIG. 13) are considered dummy structures and are removed and replaced with an active gate and active gate dielectric.

As illustrated in FIG. 14, an interlayer dielectric (ILD) 90 is formed over the structure illustrated in FIG. 13. In some embodiments, the ILD 90 is formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as an CMP process, may be performed to planarize the top surface of the ILD 90 such that the top surface of the ILD 90 is level with the top surface of the gate structure 75 (e.g., top surface of the gate 68). After the CMP process, the top surface of the gate 68 and the top surface of the second spacers 89 are exposed by the ILD 90, in some embodiments.

In accordance with some embodiments, the gate 68, the gate dielectric 66 directly under the gate 68 are removed in an etching step(s), so that recesses 99 are formed in the ILD 90. Each recess 99 exposes a channel region of a respective fin 64. Each channel region is disposed between neighboring pairs of epitaxial source/drain regions 67. During the dummy gate removal, the dummy gate dielectric layer 66 may be used as an etch stop layer when the dummy gate 68 is etched. The dummy gate dielectric layer 66 may then be removed after the removal of the dummy gate 68.

Next, in FIG. 15, a gate dielectric layer 96 and a gate electrode 98 are formed for replacement gates (may also be referred to as metal gates) 97. The gate dielectric layer 96 is deposited conformally in the recess, such as on the top surfaces and the sidewalls of the fins 64 and on sidewalls of the second spacers 89. In accordance with some embodiments, the gate dielectric layer 96 comprises silicon oxide, silicon nitride, or multilayers thereof. In other embodiments, the gate dielectric layer 96 includes a high-k dielectric material, and in these embodiments, the gate dielectric layers 96 may have a k value greater than about 7.0, and may include a metal oxide or a silicate of Hf, Al, Zr, La, Mg, Ba, Ti, Pb, and combinations thereof. The formation methods of gate dielectric layer 96 may include MBD, ALD, PECVD, and the like.

Next, a barrier layer (not shown) is formed conformally over the gate dielectric layer 96. The barrier layer may comprise an electrically conductive material such as titanium nitride, although other materials, such as tantalum nitride, titanium, or the like, may alternatively be utilized. The barrier layer may be formed using a CVD process, such as PECVD. However, other processes, such as sputtering, MOCVD, or ALD, may alternatively be used.

Next, the gate electrode 98 is deposited over the barrier layer, and fills the remaining portions of the recess 99. The gate electrode 98 may be made of a metal-containing material such as TiN, TaN, TaC, Co, Ru, Al, AlTiC, AlTiN, AlTiO, W, combinations thereof, or multi-layers thereof, and may be formed by, e.g., electroplating, electroless plating, or other suitable method. After the formation of the gate electrode 98, a planarization process, such as a CMP, may be performed to remove the excess portions of the gate dielectric layer 96, the barrier layer, and the material of the gate electrode 98, which excess portions are over the top surface of ILD 90. The resulting remaining portions of material of the gate electrode 98, the barrier layer, and the gate dielectric layer 96 thus form a replacement gate 97 of the resulting FinFET device 100.

Figure 16:
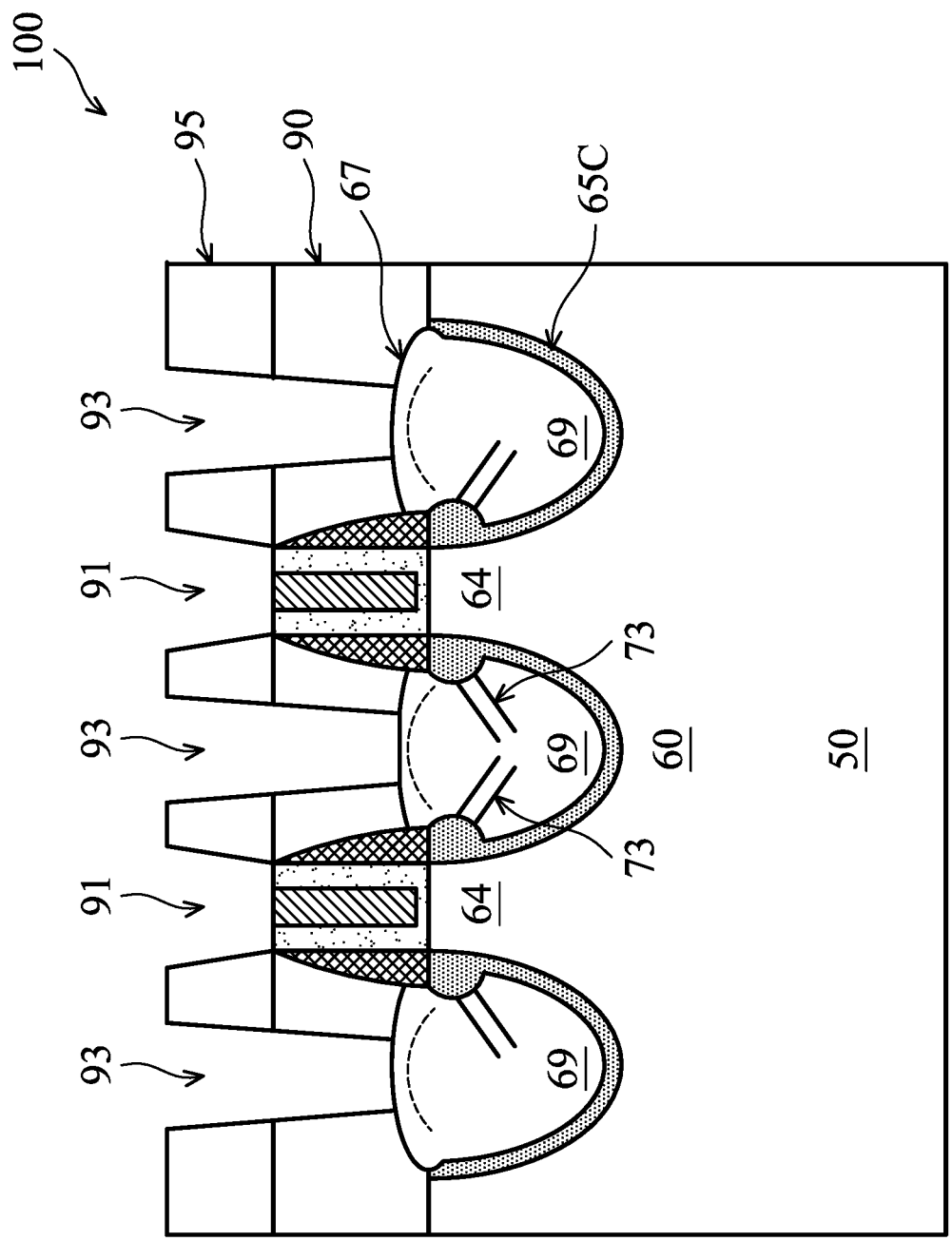

Next, in FIG. 16, an ILD 95 is deposited over ILD 90. In an embodiment, the ILD 95 is a flowable film formed by a flowable CVD method. In some embodiments, the ILD 95 is formed of a dielectric material such as PSG, BSG, BPSG, USG, or the like, and may be deposited by any suitable method, such as CVD and PECVD. Contact openings 91 and 93 for contacts 102 (see FIG. 17) are formed through the ILD 90 and/or the ILD 95. For example, the contact opening 91 are formed through the ILD 95 and exposes the replacement gate 97, while the contact openings 93 are formed through the ILD 90 and the ILD 95, and exposes source/drain regions 67.

Figure 17:
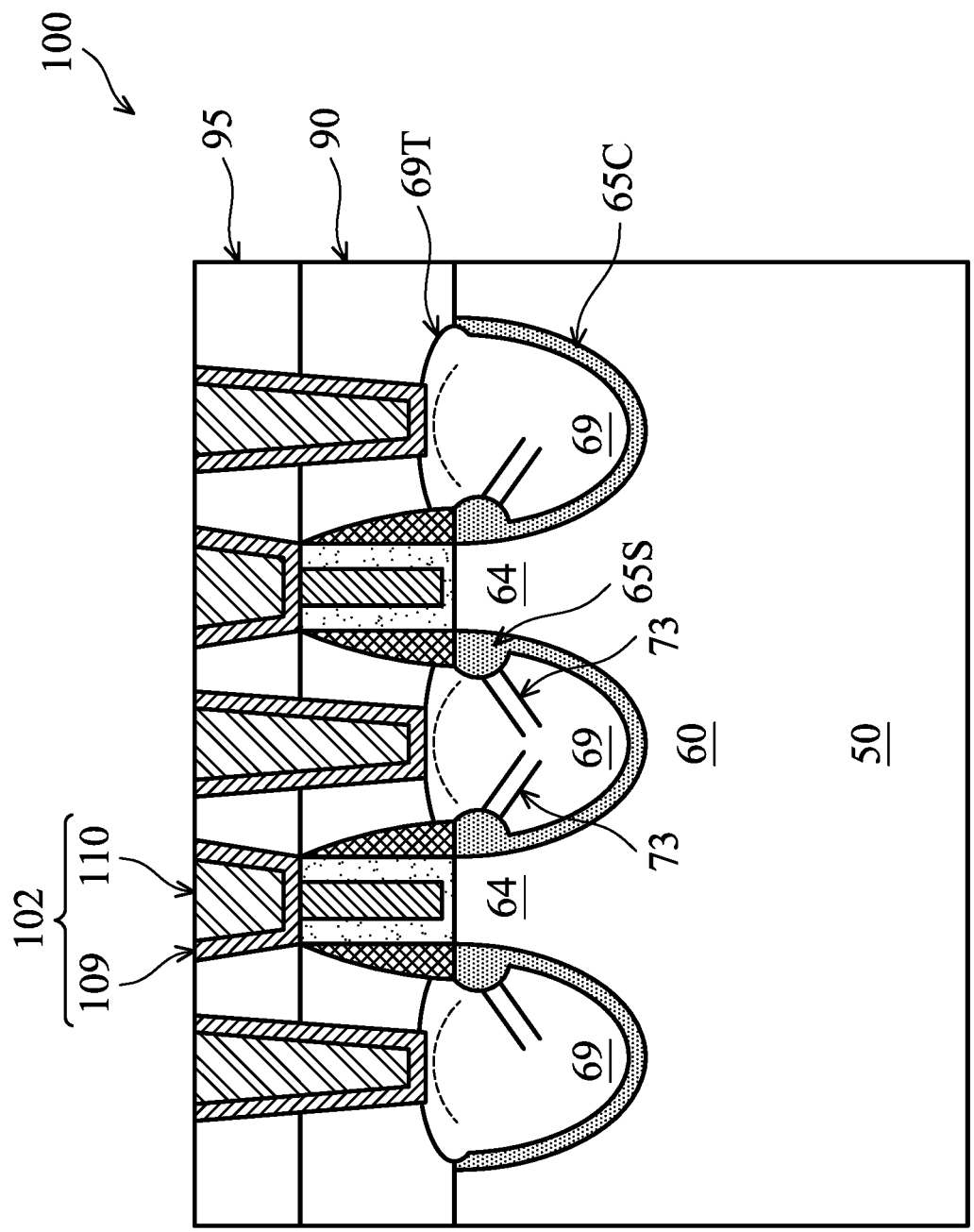

Next, in FIG. 17, a barrier layer (not shown) is formed lining sidewalls and the bottom of the contact openings 91/93. The barrier layer may comprise an electrically conductive material such as titanium (Ti), titanium nitride (TiN), tantalum (Ta), tantalum nitride (TaN), or the like, and may be formed using a CVD process, such as PECVD. However, other alternative processes, such as sputtering, MOCVD, PVD, or ALD, may also be used.

After the barrier layer is formed, a seed layer 109 is formed over the barrier layer in the contact openings 91/93. The seed layer 109 may be deposited by PVD, ALD or CVD, and may be formed of tungsten, copper, or copper alloys, although other suitable methods and materials may alternatively be used if desired.

Once the seed layer 109 has been formed, the conductive material 110 may be formed onto the seed layer 109. The conductive material 110 may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, electroplating, and reflow, may be used to form the conductive material 110.

Once the contact openings 91/93 have been filled, excess barrier layer, seed layer 108, and conductive material 110 outside of the contact openings 91/93 may be removed through a planarization process such as CMP, although any suitable removal process may be used. Contact plugs 102 are thus formed in the contact openings 91/93.

FIGS. 18 and 19 illustrate other embodiments of the present disclosure. As discussed above with reference to FIG. 10, during the etching process 810 to form the non-conformal first semiconductor layer 65, the shape of the first portions 65S of the first semiconductor layer 65 may vary, depending on, e.g., pressure of the etching process 810, the size of the dummy spacers 87, or the shape of the dummy spacers 87. Therefore, following similar processing as illustrated in FIGS. 1-17, but with different process conditions (e.g., different pressure of the etching process 810, different size of the dummy spacers 87, or different shape of the dummy spacers 87), FinFET devices with different shapes and/or dimensions for the first semiconductor layers 65, such as FinFET device 200 in FIG. 19 and FinFET device 300 in FIG. 19, may be formed.

Referring to FIG. 18, the first portion 65S of the first semiconductor layer 65 has a rectangle cross section. The other portion 65C of the first semiconductor layer 65 may have a substantially uniform thickness. In some embodiments, the first portion 65S has a thickness $T_5$ that is larger than a thickness $T_4$ of the other portions 65C of the first semiconductor layer 65. The thickness $T_5$ may range from about 1 nm to about 10 nm, and the thickness $T_4$ may range from about 1 nm to about 5 nm. A height $H_3$ of the first portions may range from about 1 nm to about 8 nm.

FIG. 19 illustrates another shape for the first portions 65S of the first semiconductor layer 65. As shown in FIG. 19, the first portion 65C has a stepped cross section that comprises a first rectangle with a first thickness $T_8$ and a second rectangle with a second thickness $T_7$. The other portion 65C of the first semiconductor layer may have a substantially uniform third thickness $T_6$. In the illustrated embodiment, $T_8$ is larger than $T_7$, and $T_8$ is larger than $T_6$. The first thickness $T_8$ may be between about 2 nm to about 10 nm. The second thickness $T_7$ may be between about 1 nm to about 10 nm. The third thickness $T_6$ may be between about 1 nm to about 5 nm. A first height $H_5$ of the first rectangle of the cross section of the first portion 65S may range from about 1 nm to about 3 nm, and a second height $H_4$ of the second rectangle of the cross section of the first portion 65S may range from about 1 nm to about 5 nm. The shapes and dimensions of the first semiconductor layer 65 illustrated in FIGS. 17-19 are non-limiting example, other shapes and dimensions are possible, and are fully intended to be included within the scope of the present disclosure.

Figure 20A:
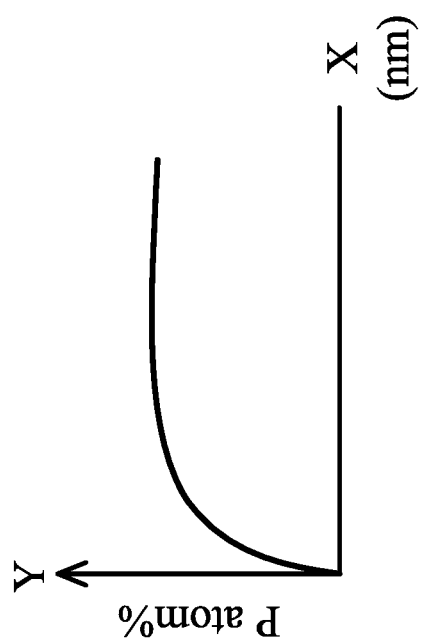
FIGS. 20A and 20B illustrate the Energy Dispersive Spectroscopy (EDS) analysis of FinFET devices, in some embodiments.
Figure 20B:
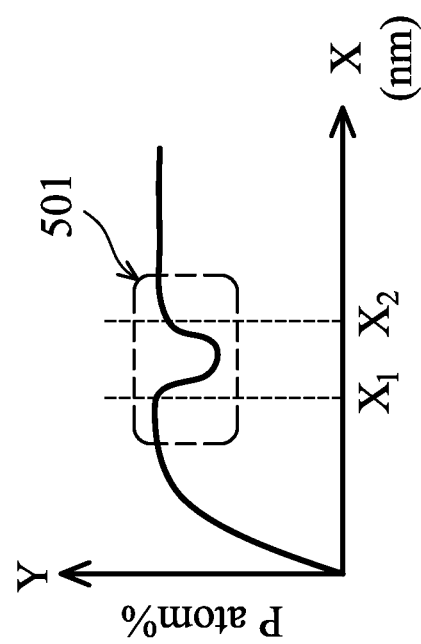

FIGS. 20A and 20B illustrate the Energy Dispersive Spectroscopy (EDS) analysis of the dopant concentration of semiconductor devices. In particular, the atomic percentages of phosphorous (P) in two different N-type FinFET devices are shown in FIGS. 20A and 20B. FIG. 20A shows the atomic percentage of P in an N-type FinFET device that has a conformal first semiconductor layer and a second semiconductor layer over the first semiconductor layer in the source/drain regions. FIG. 20B shows the atomic percentage of P in an embodiment N-type FinFET device (e.g., 100, 200, or 300) that has a non-conformal first semiconductor layer 65 with a first concentration of P and a second semiconductor layer 69 with a second concentration (e.g., higher than the first concentration) of P in the source/drain region 67. The X-axis in FIGS. 20A and 20B indicates the depth of the measurement location (e.g., the distance between the measurement location and the top of the FinFET devices), and the Y-axis in FIGS. 20A and 20B indicates the atomic percentage of P in the FinFET devices. The upper range of X-axis shown in FIGS. 20A and 20B corresponds to the bottom of the source/drain regions of the FinFET devices, in some embodiments.

In FIG. 20A, as the distance increases, the atomic percentage of P in the FinFET device increases continuously before it saturates. In contrast, as illustrated in FIG. 20B, as the distance increases, the atomic percentage of P in the embodiment FinFET device increases continuously first, then decreases (see the plot in area 501 in FIG. 20B), before increasing again and reaching a saturation value. The first portions 65S of the first semiconductor layer 65, which has a large cross section and a lower concentration of dopant (e.g., P) than the second semiconductor layer 69, may be the reason for the drop of the measured concentration of P in area 501. In some embodiments, locations of $X_1$ and $X_2$ on the X-axis may correspond to the top surface of first portions 65S and the lower surface of the first portions 65S of the first semiconductor layer 65, respectively.

Embodiments disclosed in the present disclosure were discussed in the context of FinFET devices. Skilled artisans will readily appreciate the disclosed embodiments may be adapted for other types of devices, such as planar devices. For example, by interpreting layers 50, 60 and 64 in FIGS. 6-19 as portions of a substrate in a planar device, and by interpreting gate structures 75 as gate structures of a planar device, processing steps illustrated in FIGS. 6-19 may illustrate the processing steps for forming embodiment planar devices.

Disclosed embodiments may achieve various advantages. For example, the non-conformal first semiconductor layer 65 may help to reduce current leakage from metal gate (e.g., metal gate 97) to the source/drain regions (e.g., source/drain region 67). The non-conformal first semiconductor layer 65 may also create a depletion region under the drain, thus lowering the potential barrier from the source to channel junction. The disclosed device structure may improve device performance in terms of threshold voltage $V_t$ (e.g., by lowing the $V_t$), thus helping to alleviate the short channel effect. The disclosed device structure may also help to balance trade-offs between the speed and the power consumption of the formed devices. For example, at a given power consumption constraint, higher speed of the device can be achieved.

Figure 21:
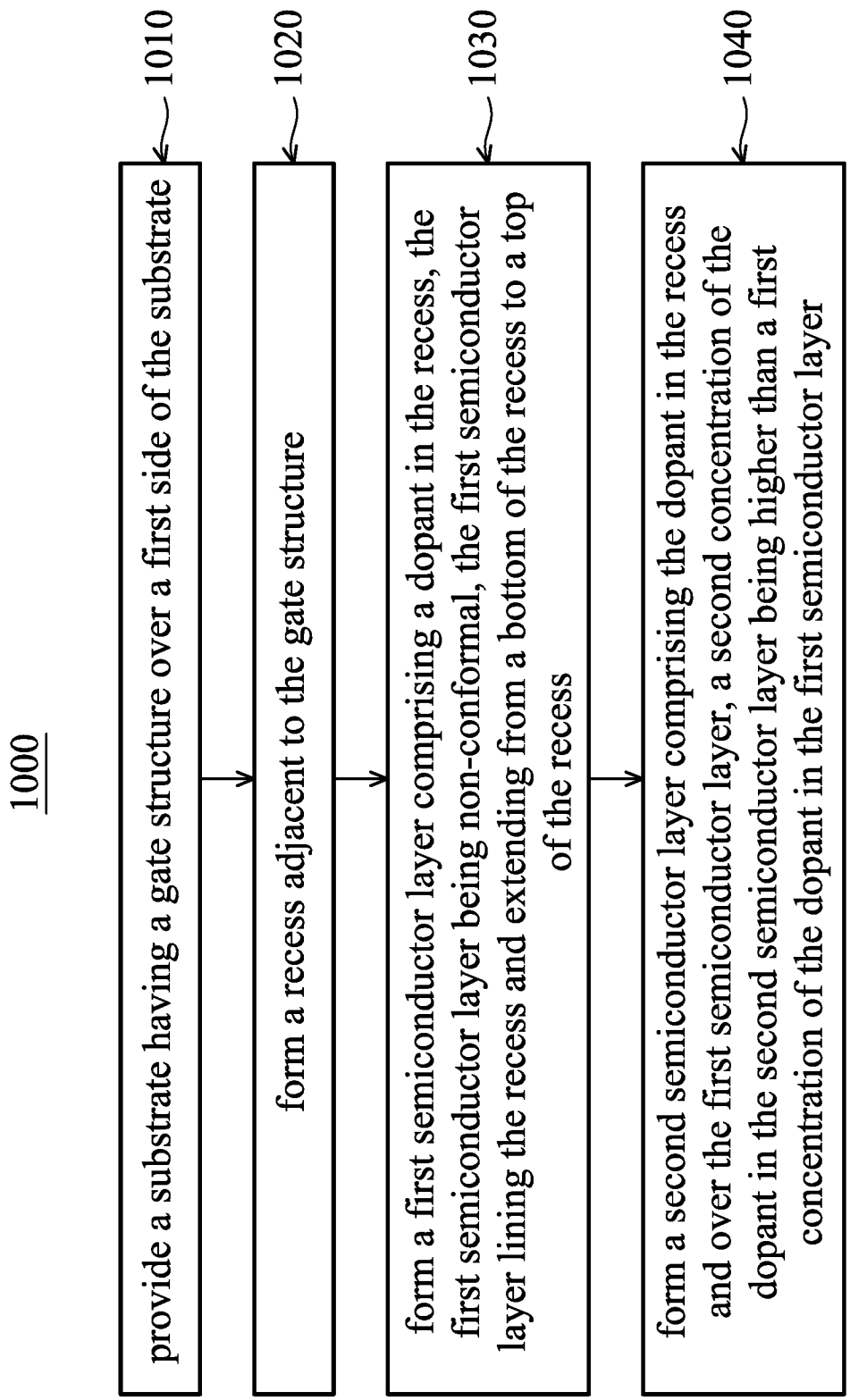
FIG. 21 illustrates a flow chart of a method of fabricating a semiconductor device, in accordance with some embodiments.

FIG. 21 illustrates a flow chart of a method of fabricating a semiconductor device, in accordance with some embodiments. It should be understood that the embodiment method shown in FIG. 21 is merely an example of many possible embodiment methods. One of ordinary skill in the art would recognize many variations, alternatives, and modifications. For example, various steps as illustrated in FIG. 21 may be added, removed, replaced, rearranged and repeated.

Referring to FIG. 21, at step 1010, a substrate having a gate structure over a first side of the substrate is provided. At step 1020, a recess is formed adjacent to the gate structure. At step 1030, a first semiconductor layer comprising a dopant is formed in the recess. The first semiconductor layer is non-conformal. The first semiconductor layer lines the recess and extends from a bottom of the recess to a top of the recess. At step 1040, a second semiconductor layer comprising the dopant is formed in the recess and over the first semiconductor layer. A second concentration of the dopant in the second semiconductor layer is higher than a first concentration of the dopant in the first semiconductor layer.

In an embodiment, a method includes providing a substrate having a gate structure over a first side of the substrate; forming a recess adjacent to the gate structure; forming a first semiconductor layer comprising a dopant in the recess, the first semiconductor layer being non-conformal, the first semiconductor layer lining the recess and extending from a bottom of the recess to a top of the recess; and forming a second semiconductor layer comprising the dopant in the recess and over the first semiconductor layer, a second concentration of the dopant in the second semiconductor layer being higher than a first concentration of the dopant in the first semiconductor layer. In an embodiment, the second concentration is ten times or more higher than the first concentration. In an embodiment, the first semiconductor layer and the second semiconductor layer include silicon, and the dopant includes phosphorous. In an embodiment, the first semiconductor layer and the second semiconductor layer include silicon germanium, and the dopant includes boron. In an embodiment, forming the first semiconductor layer includes depositing in the recess a semiconductor material comprising the dopant; forming first spacers over sidewalls of the gate structure, the first spacers disposed on end portions of the semiconductor material proximate the first side of the substrate; and performing an etching process to remove some of the semiconductor material, a remaining portion of the semiconductor material forming the first semiconductor layer, where the first spacers shield the end portions of the semiconductor material from the etching process such that after the etching process, portions of the first semiconductor layer under the first spacers has a first thickness that is larger than a second thickness of other portions of the first semiconductor layer. In an embodiment, depositing the semiconductor material includes epitaxially growing the semiconductor material in the recess. In an embodiment, performing the etching process includes performing a dry etch process. In an embodiment, the dry etch process includes a plasma process using CF4 and O2. In an embodiment, the method further includes removing the first spacers after forming the first semiconductor layer; and after removing the first spacers and before forming the second semiconductor layer, forming second spacers over the sidewalls of the gate structure. In an embodiment, the first semiconductor layer has a first portion proximate the first side of the substrate, where the first portion has a first thickness larger than a second thickness of a second portion of the first semiconductor layer disposed between the first side of the substrate and a bottom of the recess. In an embodiment, the second semiconductor layer fills the recess, and where dislocations are formed in the second semiconductor layer. In an embodiment, the dislocations form a V-shape.

In an embodiment, a method of forming a Fin Field Effect Transistor (FinFET) device includes forming a fin protruding above a substrate; forming a gate structure over the fin; forming a recess in the fin adjacent to the gate structure; depositing a semiconductor material in the recess, the semiconductor material lining sidewalls and a bottom of the recess; forming a first spacer on a sidewall of the gate structure, the first spacer covering a portion of the semiconductor material proximate a top surface of the fin; etching the semiconductor material, wherein remaining portions of the semiconductor material after the etching form a first semiconductor layer, wherein the first semiconductor layer has a first portion proximate the top surface of the fin, and a second portion between the first portion and the bottom of the recess, wherein the first portion has a first thickness larger than a second thickness of the second portion; and forming a second semiconductor layer in the recess and over the first semiconductor layer. In an embodiment, the method further includes removing the first spacer after the etching; and forming a second spacer on the sidewall of the gate structure before forming the second semiconductor layer. In an embodiment, depositing the semiconductor material uses a first precursor having silicon and a second precursor having a dopant, and a ratio of a flow rate of the second precursor over a flow rate of the first precursor has a first value, wherein the forming the second semiconductor layer uses the first precursor and the second precursor, and the ratio of the flow rate of the second precursor over the flow rate of the first precursor has a second value, wherein the second value is larger than the first value. In an embodiment, the first semiconductor layer and the second semiconductor layer have a same dopant, wherein a concentration of the dopant in the second semiconductor layer is ten times or more than a concentration of the dopant in the first semiconductor layer. In an embodiment, forming the second semiconductor layer produces V-shaped dislocations in the second semiconductor layer.

In an embodiment, a Fin Field Effect Transistor (FinFET) device includes a fin protruding above a substrate; a first gate structure over the fin; spacers on sidewalls of the first gate structure; a source/drain region on a first side of the first gate structure and in a recess of the fin, the source/drain region includes a first semiconductor layer extending from a top surface of the fin into a bottom of the recess, a first portion of the first semiconductor layer proximate the top surface of the fin is thicker than a second portion of the first semiconductor layer proximate the bottom of the recess; and a second semiconductor layer over the first semiconductor layer and filling the recess. In an embodiment, the source/drain region further includes V-shaped dislocations. In an embodiment, the first semiconductor layer and the second semiconductor layer include a same dopant, wherein a first concentration of the dopant in the first semiconductor layer is lower than a second concentration of the dopant in the second semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a Fin Field-Effect Transistor (FinFET) device, the method comprising:
    forming a gate structure over a fin;
    forming a recess in the fin adjacent to the gate structure;
    forming a first semiconductor layer in the recess;
    forming a dummy spacer along a sidewall of the gate structure and over an end portion of the first semiconductor layer proximate to an upper surface of the fin;
    reshaping the first semiconductor layer by performing a first etching process, the dummy spacer shielding the end portion of the first semiconductor layer from the first etching process; and
    replacing the dummy spacer with a spacer after the first etching process.

2. The method of claim 1, wherein forming the first semiconductor layer comprises conformally forming the first semiconductor layer to line sidewalls and a bottom of the recess.

3. The method of claim 2, wherein after reshaping the first semiconductor layer, the first semiconductor layer is a non-conformal layer, wherein the end portion of the first semiconductor layer has a first width that is wider than a second width of a second portion of the first semiconductor layer in the recess.

4. The method of claim 3, wherein reshaping the first semiconductor layer comprising adjusting a shape of the end portion of the first semiconductor layer by adjusting one or more process conditions of the first etching process.

5. The method of claim 3, wherein after reshaping the first semiconductor layer, the end portion of the first semiconductor layer has a flat top surface and a curved sidewall.

6. The method of claim 3, wherein after reshaping the first semiconductor layer, the end portion of the first semiconductor layer has a rectangular shaped cross section.

7. The method of claim 3, wherein after reshaping the first semiconductor layer, the end portion of the first semiconductor layer has a stepped cross section that comprises a first rectangle with a first thickness and a second rectangle with a second thickness, wherein the first thickness is larger than the second thickness.

8. The method of claim 1, further comprising, after replacing the dummy spacer, filling the recess by forming a second semiconductor layer.

9. The method of claim 8, wherein the first semiconductor layer is formed of a first semiconductor material with a first dopant, and the second semiconductor layer is formed of the first semiconductor material with the first dopant, wherein a first dopant concentration of the first dopant in the first semiconductor layer is lower than a second dopant concentration of the first dopant in the second semiconductor layer.

10. The method of claim 1, wherein replacing the dummy spacer comprises:
    removing the dummy spacer by performing a second etching process; and
    after removing the dummy spacer, forming the spacer over the end portion of the first semiconductor layer.

11. The method of claim 10, wherein the first etching process is a dry etch process, and the second etching process is a wet etch process.

12. A Fin Field-Effect Transistor (FinFET) device comprising:
    a fin over a substrate;
    a gate structure over the fin; and
    a source/drain region at least partially in the fin and adjacent to the gate structure, the source/drain region comprising:
        a first semiconductor layer extending from an upper surface of the fin into the fin, wherein the first semiconductor layer is non-conformal, and a first end portion of the first semiconductor layer proximate to the upper surface of the fin has a first thickness larger than a second thickness of a middle portion of the first semiconductor layer, wherein the middle portion of the first semiconductor layer is closer to the substrate than the first end portion of the first semiconductor layer; and a second semiconductor layer over the first semiconductor layer, wherein the first semiconductor layer and the second semiconductor layer comprise a semiconductor material doped with a dopant, wherein a first dopant concentration of the dopant in the first semiconductor layer is different from a second dopant concentration of the dopant in the second semiconductor layer.

13. The FinFET device of claim 12, further comprising a gate spacer along a sidewall of the gate structure, wherein the gate spacer is directly over and contact the first end portion of the first semiconductor layer.

14. The FinFET device of claim 12, wherein the source/drain region further comprises dislocations extending from the first end portion of the first semiconductor layer toward a center of the source/drain region.

15. The FinFET device of claim 12, wherein an atomic percentage of the dopant increases from a top surface of the FinFET device to a first depth into the FinFET device, then decreases from the first depth to a second depth larger than the first depth, then increases again from the second depth to a third depth larger than the second depth.

16. A Fin Field-Effect Transistor (FinFET) device comprising:

a fin protruding above a substrate;

a gate structure over the fin;

a gate spacer along a sidewall of the gate structure; and a source/drain region over the fin and adjacent to the gate structure, the source/drain region comprising:

a first semiconductor layer having a first end portion, a second end portion, and a middle portion, wherein the first end portion and the second end portion are proximate to an upper surface of the fin distal from the substrate, wherein the middle portion is laterally between the first end portion and the second end portion, and is closer to the substrate than the first end portion and the second end portion, wherein the first end portion is under the gate spacer and is thicker than the middle portion; and a second semiconductor layer over the first semiconductor layer.

17. The FinFET device of claim 16, wherein a lower surface of the second semiconductor layer contacts the first semiconductor layer, and an upper surface of the second semiconductor layer extends above the upper surface of the fin.

18. The FinFET device of claim 17, wherein the first semiconductor layer and the second semiconductor layer comprise a semiconductor material with a dopant, wherein a first dopant concentration of the first semiconductor layer is lower than a second dopant concentration of the second semiconductor layer.

19. The FinFET device of claim 18, wherein the second semiconductor layer includes a lower portion below the upper surface of the fin and an upper portion over the lower portion, wherein a boundary between the lower portion and the upper portion is level with the upper surface of the fin, wherein the upper portion of the second semiconductor layer has a higher concentration of the dopant than the lower portion of the second semiconductor layer, wherein the lower portion of the second semiconductor layer has a higher concentration of the dopant than the first semiconductor layer.

20. The FinFET device of claim 16, wherein the source/drain region further comprises dislocations extending from the first end portion of the first semiconductor layer toward a center axis of the source/drain region, wherein no dislocation extends from the second end portion of the first semiconductor layer toward the center axis of the source/drain region.

* * * * *